(12) United States Patent
Satoh et al.

(10) Patent No.: US 7,592,873 B2
(45) Date of Patent: Sep. 22, 2009

(54) LOW NOISE AMPLIFIER

(75) Inventors: Hiroyuki Satoh, Kawasaki (JP); Hiroshi Yamazaki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/207,247

(22) Filed: Sep. 9, 2008

(65) Prior Publication Data

US 2009/0009250 A1    Jan. 8, 2009

Related U.S. Application Data

(63) Continuation of application No. PCT/JP2006/304772, filed on Mar. 10, 2006.

(51) Int. Cl.
*H03F 3/191* (2006.01)

(52) U.S. Cl. .................. 330/305; 330/278; 330/144

(58) Field of Classification Search .............. 330/305, 330/278, 144
See application file for complete search history.

(56) References Cited

U.S. PATENT DOCUMENTS

| | | | |
|---|---|---|---|
| 3,902,078 A * | 8/1975 | Peterson | 327/388 |
| 4,234,853 A * | 11/1980 | Yamaguchi | 330/280 |
| 4,395,643 A * | 7/1983 | Lehmann | 327/308 |
| 4,630,006 A * | 12/1986 | Anderson | 331/117 R |
| 6,229,370 B1 * | 5/2001 | Inamori et al. | 327/308 |
| 6,535,065 B2 * | 3/2003 | Aoki | 330/284 |

FOREIGN PATENT DOCUMENTS

| | | |
|---|---|---|
| JP | 46-044839 | 9/1974 |
| JP | 50-104305 | 5/1977 |
| JP | 54-094858 A | 7/1979 |
| JP | 5-235656 A | 9/1993 |
| JP | 7-249951 A | 9/1995 |

* cited by examiner

*Primary Examiner*—Patricia Nguyen
(74) *Attorney, Agent, or Firm*—Arent Fox LLP

(57) ABSTRACT

For a first transistor, a source thereof is coupled to an input terminal and a drain thereof is coupled to an output terminal. A first variable impedance circuit is arranged between a gate of the first transistor and ground, and the impedance thereof is changed according to a first control signal. A second variable impedance circuit is arranged between the gate and the source of the first transistor, and the impedance thereof is changed according to a second control signal. Furthermore, an impedance circuit is arranged between the gate of the first transistor and a power supply. The ratio of the impedances of the first and second variable impedance circuits can be set to an arbitrary value according to the first and second control signals in order to change the gain of the low noise amplifier. As the result, the generation of unwanted thermal noise can be prevented.

19 Claims, 21 Drawing Sheets

| attenuate state | Gm | resistance | Zin |
|---|---|---|---|
| state 1 | $gm$ | $\infty$ | $\dfrac{1}{gm}$ |
| state 2 | $\dfrac{2}{3}gm$ | $R1$ | $\dfrac{3R1}{3+2gm \cdot R1}$ |
| state 3 | $\dfrac{1}{3}gm$ | $\dfrac{R1 \cdot R2}{R1+R2}$ | $\dfrac{3R1 \cdot R2}{3(R1+R2)+gm \cdot R1 \cdot R2}$ |

Fig. 8

LOW NOISE AMPLIFIER

CROSS-REFERENCE TO RELATED APPLICATION

This application is a Continuation Application of International Application No. PCT/JP2006/304772, filed Mar. 10, 2006, designating the U.S., the entire contents of which are incorporated herein by reference.

BACKGROUND

1. Field

The present invention relates to a low noise amplifier used in a radio receiver and the like.

2. Description of the Related Art

A radio receiver requires an amplifier that amplifies a small input signal. However, the noise in amplifying an input signal becomes relatively large as the input signal becomes smaller, and the signal to noise ratio (S/N ratio) will decrease. Then, in order to reduce the noise caused by amplification, an LNA (Low Noise Amplifier) has been proposed.

Meanwhile, if the frequency band of an input signal is wide, an impedance of an antenna and an input impedance of a low noise amplifier need to be matched to each other over a wide bandwidth. For this reason, a low noise amplifier configured using an FET (Field Effect Transistor) is usually of a common-gate type, for example Japanese Laid-open Patent Publication No. H05-235656.

Moreover, in cases where the input level of an input signal fluctuates, a function to make the gain variable is required in order to keep the output level of the amplifier constant. For this reason, an amplifier having an attenuator circuit, for example a resistor network, a ladder network, provided in the signal path at a preceding stage of the amplifier has been proposed, for example, in Japanese Laid-open Patent Publication No. H07-249951.

However, in the variable gain amplifier using the attenuator circuit, thermal noise arises from resistors and therefore the noise characteristics will be degraded. In particular, it is undesirable to provide an attenuator circuit at a preceding stage of the low noise amplifier.

SUMMARY

According to one aspect of embodiments, a low noise amplifier is provided which includes a first transistor having a source coupled to an input terminal and a drain coupled to an output terminal, a first variable impedance circuit arranged between a gate of the first transistor and ground, and having an impedance changed according to a first control signal, a second variable impedance circuit arranged between the gate and source of the first transistor, and having an impedance changed according to a second control signal, and an impedance circuit arranged between the gate of the first transistor and a power supply.

BRIEF DESCRIPTION OF THE DRAWINGS

FIG. 8 illustrates an example of correcting impedance of the low noise amplifier shown in FIG. 7.

DETAILED DESCRIPTION OF THE EMBODIMENTS

Figure 1:
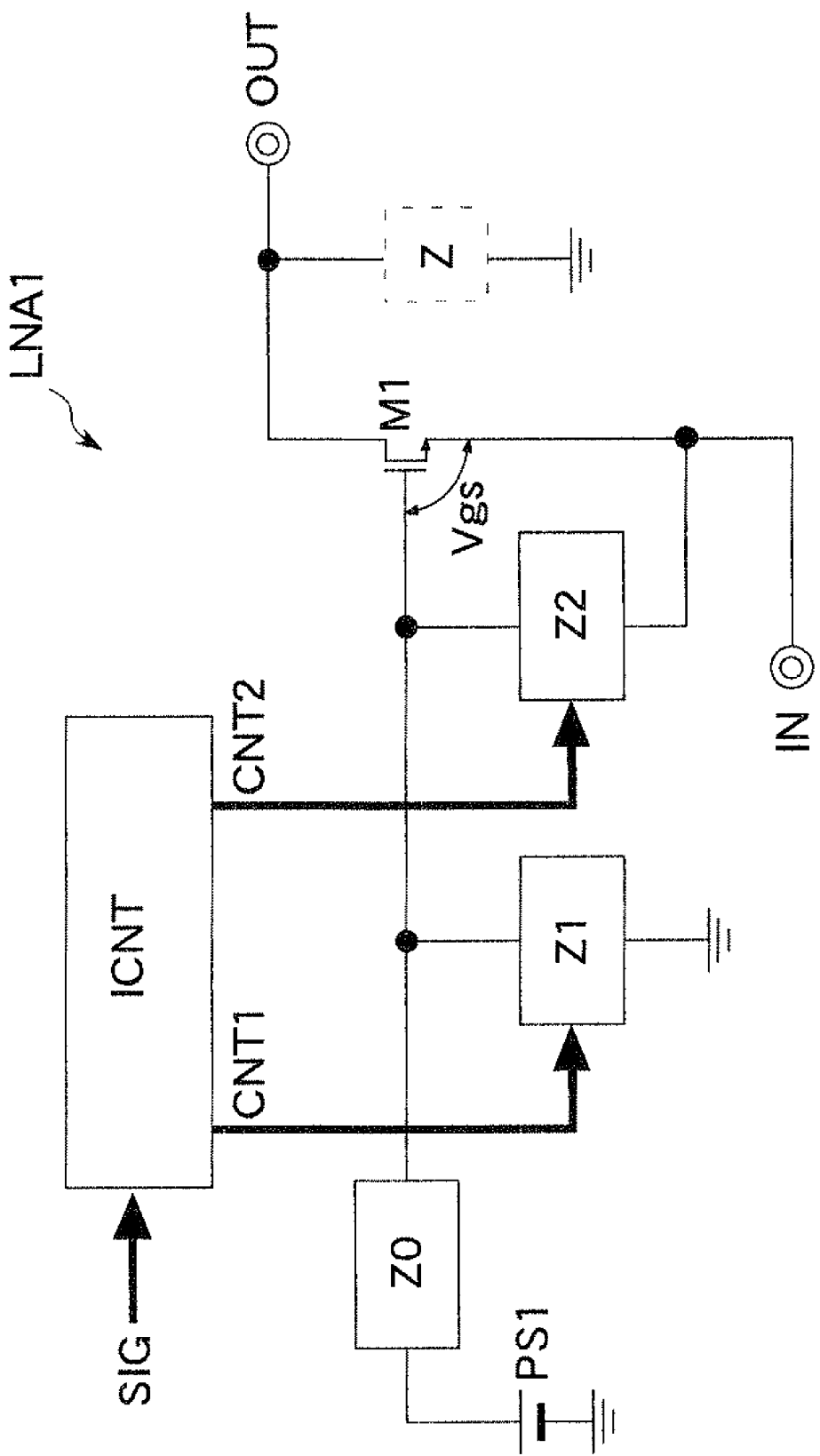
FIG. 1 illustrates a first embodiment of a low noise amplifier of the present invention.

Hereinafter, embodiments of the present invention will be described using the accompanying drawings. In the drawings, each signal line indicated by a wide line includes a plurality of lines. A part of a block to which the wide line is coupled includes a plurality of circuits. Each signal line through which a signal is transmitted is denoted using the same reference symbol as the signal name.

FIG. 1 shows a first embodiment of a low noise amplifier of the present invention. A low noise amplifier LNA1 of this embodiment has an enhancement type nMOS transistor M1 (first transistor), a first variable impedance circuit Z1, a second variable impedance circuit Z2, an impedance circuit Z0, and a control circuit ICNT. The transistor M1 has a source coupled to an input terminal IN and a drain coupled to an output terminal OUT. A gate of the transistor M1 is coupled to a power supply PS1 (voltage source, e.g., power source line) via the impedance circuit Z0. This allows a predetermined gate voltage to be applied to the gate of the transistor M1. Thereby, the low noise amplifier LNA1 (transistor M1) operates as a gate grounded amplifier.

The first variable impedance circuit Z1 is arranged between the gate of the transistor M1 and ground. The first variable impedance circuit Z1 has impedance changed according to the logical value (voltage level) of a first control signal CNT1 from the control circuit ICNT. The second variable impedance circuit Z2 is arranged between the gate and the source of the transistor M1. The second variable impedance circuit Z2 has impedance changed according to the logical value (voltage level) of a second control signal CNT2 from the control circuit ICNT.

The control circuit ICNT generates the control signals CNT1-2 according to the signal strength of an amplified signal output to the output terminal OUT of the transistor M1, for example. The control circuit ICNT functions as a circuit that controls the impedance ratio of the variable impedance circuits Z1, Z2. That is, the impedance ratio of the variable impedance circuits Z1, Z2 can be set to an arbitrary value according to the control signals CNT1-2. An amplitude Vgs (hereinafter, also referred to as a voltage amplitude Vgs) of the gate-to-source voltage of the transistor M1 is multiplied by Z1/(Z1+Z2) relative to the amplitude of the input signal IN (hereinafter, also referred to as the input amplitude). Here, Z1, Z2 represent the impedances of the variable impedance circuits Z1, Z2. In this way, the voltage amplitude Vgs can be changed by the control circuit ICNT. That is, the variable-gain low noise amplifier LNA1 can be configured. Accordingly, the gain adjustment for keeping the output level of the low noise amplifier LNA1 constant can be made easily. In particular, this is effective when the input power level (reference level) input to the low noise amplifier LNA1 fluctuates.

For example, if Zsum is a sum of the impedances Z1, Z2 and the impedance Z2 is approximately equal to Zsum (impedance Z1 is almost zero), then the voltage amplitude Vgs 10 becomes approximately the same as the input amplitude. On the other hand, if the impedance Z1 is approximately equal to Zsum (impedance Z2 is approximately zero), then the input terminal IN is electrically coupled to the gate of the transistor M1 and therefore the voltage amplitude Vgs becomes approximately zero. That is, the input signal IN will not be amplified.

In the low noise amplifier LNA1 shown in FIG. 1, an element (e.g., an attenuator circuit, such as a resistor network) causing an increase in noise is not arranged in the signal path from the input terminal IN to the output terminal OUT. Thus, the generation of unwanted thermal noise can be prevented and the noise characteristics of the low noise amplifier LNA1 can be improved.

Figure 2:
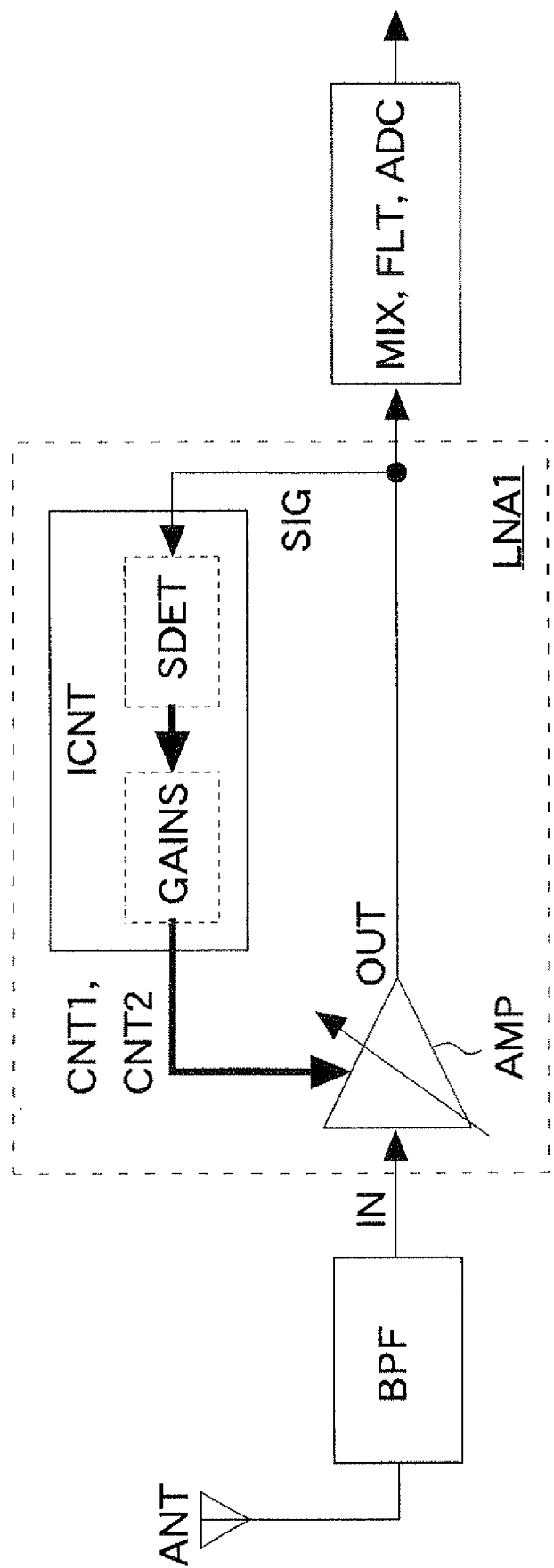
FIG. 2 illustrates a radio receiver which the low noise amplifier in FIG. 1 is mounted.

FIG. 2 shows a radio receiver in which the low noise amplifier LNA1 shown in FIG. 1 is mounted. For example, the radio receiver is incorporated into a mobile phone. The radio receiver includes a band pass filter BPF coupled to the input terminal IN of the low noise amplifier LNA1, an antenna ANT, a mixer MIX coupled to the output terminal of the low noise amplifier LNA1, a filter FLT, and an A/D converter ADC. In FIG. 2, the elements except for the antenna ANT are incorporated into one chip, for example. Note that, if the radio receiver receives only a signal having a specific frequency, the band pass filter BPF is not required.

An amplifier AMP shown in the low noise amplifier LNA1 includes the transistor M1 and the variable impedance circuits Z1, Z2 shown in FIG. 1. The control circuit ICNT has a signal strength detection unit SDET and a gain set unit GAINS. The signal strength detection unit SDET detects the signal strength of an amplified signal SIG output to the output terminal OUT, and outputs the detected value to the gain set unit GAINS, as a digital value DET. The gain set unit GAINS calculates the impedance ratio of the impedance circuits Z1, Z2 in accordance with the digital value DET, and generates the control signals CNT1-2 for setting the calculated impedance ratio. Here, the control circuit ICNT operates, for example, at a predetermined frequency and changes the values of the control signals CNT1-2 for each operation.

As described above, in the first embodiment, by configuring the variable-gain low noise amplifier LNA1 without using an element that causes an increase in noise, the noise characteristics of the low noise amplifier LNA1 can be improved. Due to an improvement in the noise characteristics of the low noise amplifier LNA1, the noise characteristics required for a circuit that is coupled to the output OUT of the low noise amplifier LNA1 can be relaxed. Thereby, the conversion accuracy of the A/D converter ADC can be improved, for example, or a less expensive A/D converter can be used. As a result, the performance of the radio receiver can be improved or the cost of the radio receiver can be reduced.

Figure 3:
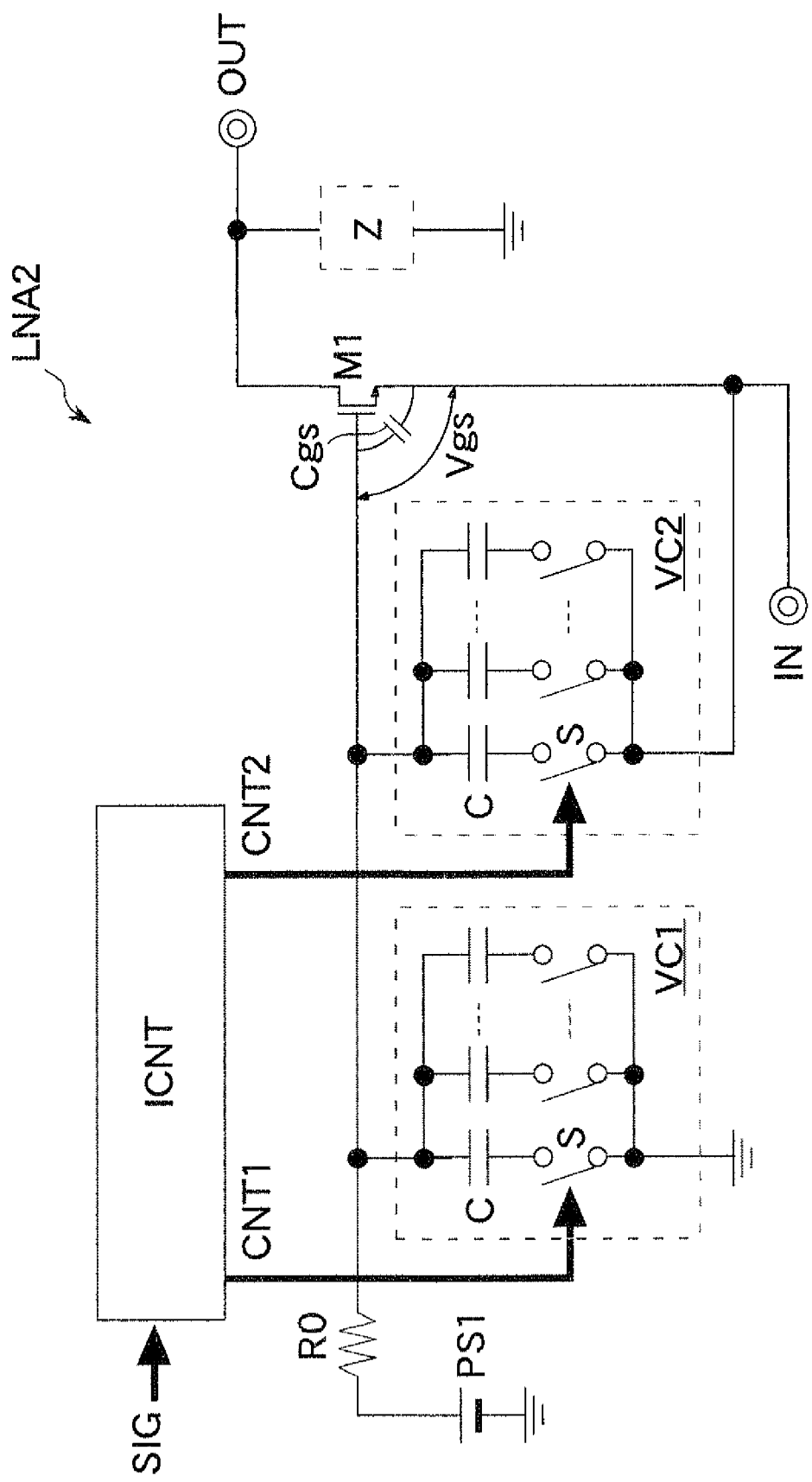
FIG. 3 illustrates a second embodiment of a low noise amplifier of the present invention.

FIG. 3 shows a second embodiment of the low noise amplifier of the present invention. The same element as that described in the first embodiment is given the same reference symbol to omit the detailed description thereof. In a low noise amplifier LNA2 of this embodiment, the variable impedance circuits Z1, Z2 shown in FIG. 1 are formed as variable capacitance circuits VC1, VC2. Moreover, the impedance circuit Z0 shown in FIG. 1 is formed as a resistor R0. The resistance value of the resistor R0 is set sufficiently larger than the impedances of the variable capacitance circuits VC1, VC2 (e.g., from approximately 10 to 100 times) in a frequency band handled by the low noise amplifier LNA2. This configures a gate grounded amplifier having a gate which is high-frequency grounded via the variable capacitance circuit VC1. The low noise amplifier LNA2 is formed using an MOS process and is mounted in the radio receiver shown in FIG. 2. Other configurations are the same as those of the first embodiment.

The variable capacitance circuit VC1 has a plurality of capacitors C coupled in parallel between the gate of the transistor M1 and ground, and a plurality of switches S coupled in series to the capacitors C, respectively. For example, the number of bits of the control signal CNT1 is the same as the number of the switches S. Each bit of the control signal CNT1 is coupled to a control terminal of the switch S. The switch S is, for example, formed of an nMOS transistor that receives the control signal CNT1 at the gate. Each switch S is turned on when a bit corresponding to the control signal CNT1 is at a high logical level, and is turned off when it is at a low logical level. Then, the impedance of the variable capacitance circuit VC1 varies according to the number of switches S to turn on.

The capacitor C is formed using a gate insulator film (gate capacitance) of a MOS transistor or a junction capacitance of a diffusion layer. The capacitance value of the capacitor C is designed sufficiently larger than a parasitic capacitance Cgs formed between the gate and the source of the transistor M1. The capacitor C and the switch C can be formed easily in the low noise amplifier LNA1 that is formed using the MOS process.

The variable capacitance circuit VC2 is the same circuit as the variable capacitance circuit VC1. Note that the number of capacitors C and switches S may be made the same as that of the variable capacitance circuit VC1 or may differ from that. If the number is made the same, the design data can be shared between the variable capacitance circuits VC1-2 and therefore the design cost can be reduced.

The control circuit ICNT controls a ratio of the impedances VC1, VC2 of the variable capacitance circuits VC1, VC2. Hereinafter, this embodiment is described with a sum of the impedances VC1, VC2 being VC0. If the impedance VC1 is approximately equal to the impedance VC0 (impedance VC2 is approximately zero), then the gate of the transistor M1 is high-frequency grounded. For this reason, the voltage amplitude Vgs is the same as the voltage amplitude of the input signal IN. In this case, the voltage gain at the output terminal OUT is a product of a transconductance gm of the transistor M1 and an output impedance Z indicated by a broken-line box in the view.

If the impedance VC1 is equal to the impedance VC2, then the voltage amplitude input to the gate grounded amplifier (transistor M1) is a half the voltage amplitude of the input signal IN. For this reason, the gain decreases by 6 dB as compared with the case where the impedance VC1 is approximately equal to the impedance VC0.

If the impedance VC2 is approximately equal to the impedance VC0 (impedance VC1 is approximately zero), then the impedance VC2 is a low impedance and therefore the gate and the source of the transistor M1 are short-circuited. Accordingly, the voltage amplitude Vgs will not vary in accordance with the voltage of the input signal, and the gain is approximately zero.

As described above, also in the second embodiment, the same effects as those of the first embodiment described above can be obtained. Furthermore, in this embodiment, by forming the low noise amplifier LNA2 using the capacitors C and the switches S that can be formed easily, the development cost and the manufacturing cost of the low noise amplifier LNA2 can be reduced.

Figure 4:
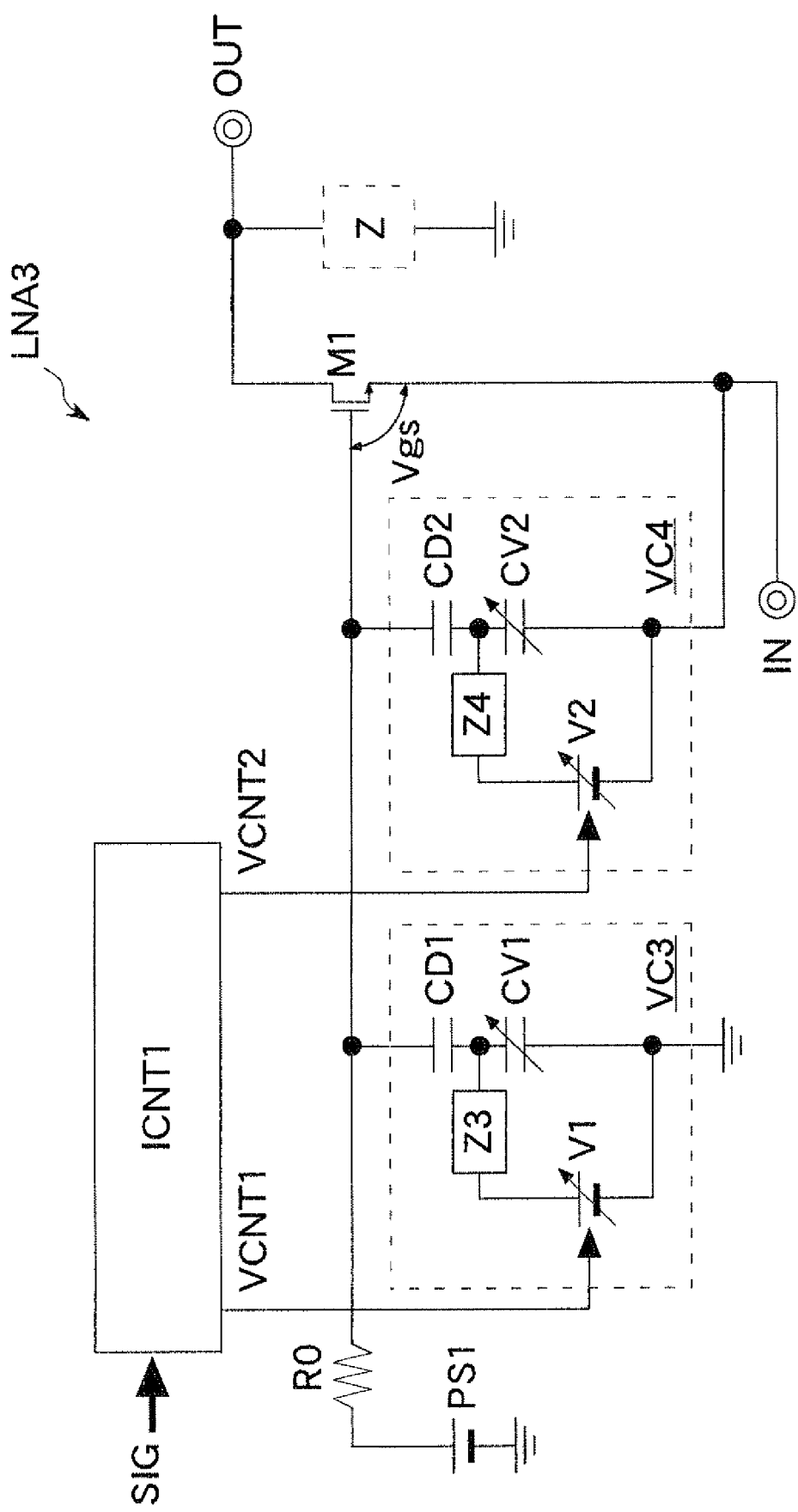
FIG. 4 illustrates a third embodiment of a low noise amplifier of the present invention.

FIG. 4 shows a third embodiment of the low noise amplifier of the present invention. The same element as that described in the first and second embodiments is given the same reference symbol to omit the detailed description thereof. In a low noise amplifier LNA3 of this embodiment, the variable impedance circuits Z1, Z2 shown in FIG. 1 are formed as variable capacitance circuits VC3, VC4. Moreover, the impedance circuit Z0 shown in FIG. 1 is formed as the resistor R0. The resistance value of the resistor R0 is sufficiently larger than the impedances of the variable capacitance circuits VC3, VC4 (e.g., from approximately 10 to 100 times) in a frequency band handled by the low noise amplifier LNA3. The low noise amplifier LNA3 is formed using the MOS process and is mounted in the radio receiver shown in FIG. 2. A control circuit ICNT1 outputs control voltages VCNT1, VCNT2 in order to change a ratio of the impedances of the variable capacitance circuits VC3, VC4 according to the signal strength of the amplified signal SIG. The control voltages VCNT1, VCNT2 are analog voltages and vary continuously. Other configurations are the same as those of the first and second embodiments. That is, the low noise amplifier LNA3 (transistor M1) operates as a gate grounded amplifier.

The variable capacitance circuit VC3 has a fixed capacitor CD1 whose capacitance value will not vary, and a variable capacitor CV1 whose capacitance value varies, the fixed capacitor CD1 and the variable capacitor CV1 being coupled in series between the gate of the transistor M1 and ground. For example, the variable capacitor CV1 is configured of a MOS type varicap diode (generally, also referred to as a varactor diode). Moreover, the variable capacitance circuit VC3 has: a variable power supply V1 for providing a variable voltage to a coupling node between the capacitors CD1, CV1; and an impedance element Z3. The variable power supply V1 changes the voltage continuously according to changes in the control voltage CNT1, for example. A terminal on the variable power supply V1 side of the impedance element Z3 functions as a voltage input terminal to receive the variable voltage.

The circuit configuration of the variable capacitance circuit VC4 is the same as that of the variable capacitance circuit VC3 except the characteristic of each element. That is, the variable capacitance circuit VC4 has a fixed capacitor CD2 and a variable capacitor CV2 (varicap diode) coupled in series between the gate of the transistor M1 and ground, and a variable power supply V2 and an impedance element Z4 for providing a variable voltage to a coupling node between the capacitors CD2, CV2. The variable power supply V2 changes the voltage continuously according to changes in a control voltage CNT2, for example. A terminal on the variable power supply V2 side of the impedance element Z4 functions as a voltage input terminal to receive the variable voltage.

The capacitance values of the capacitors CD1, CD2 will not vary, but are fixed. The capacitance values of the capacitors CV1, CV2 vary continuously according to changes in the voltage values of the variable power supplies V1, V2 that are provided via the impedance elements Z3, Z4, respectively. The capacitance values of the capacitors CD1, CD2 are designed sufficiently large as compared with those of the capacitance values of the capacitors CV1, CV2 (no less than 10 times). This allows the capacitors CV1, CV2 to function as a variable capacitor. In this embodiment, since the capacitance values of the capacitors CV1, CV2 can vary continuously, the impedances of the variable capacitance circuits VC3, VC3 can be set in fine increments.

The impedance Rz of the impedance element Z3 (or Z4) needs to be set higher than the impedances of the capacitors CD1, CV1 (or CD2, CV2) in frequencies of the input signal received at the input terminal IN. Specifically, the impedance Rz needs to be higher than $1/(2\pi f \times Cd)$ and $1/(2\pi f \times Cv)$. Here, "f" represents a frequency of the input signal received at the input terminal IN. "Cd", "Cv" represent the capacitance values of the capacitors CD1, CV1 (or CD2, CV2), respectively.

As described above, also in the third embodiment, the same effects as those of the first and second embodiments described above can be obtained. Furthermore, in this embodiment, the capacitors CV1, CV2 operate as a varicap diode in response to a continuously varying voltage. Since the capacitance values of the capacitors CV1, CV2 can be changed continuously, the impedances of the variable capacitance circuits VC3, VC4 can be set in fine increments. As a result, the noise characteristics can be improved in the low noise amplifier LNA3 that can keep the output level constant with high accuracy.

Figure 5:
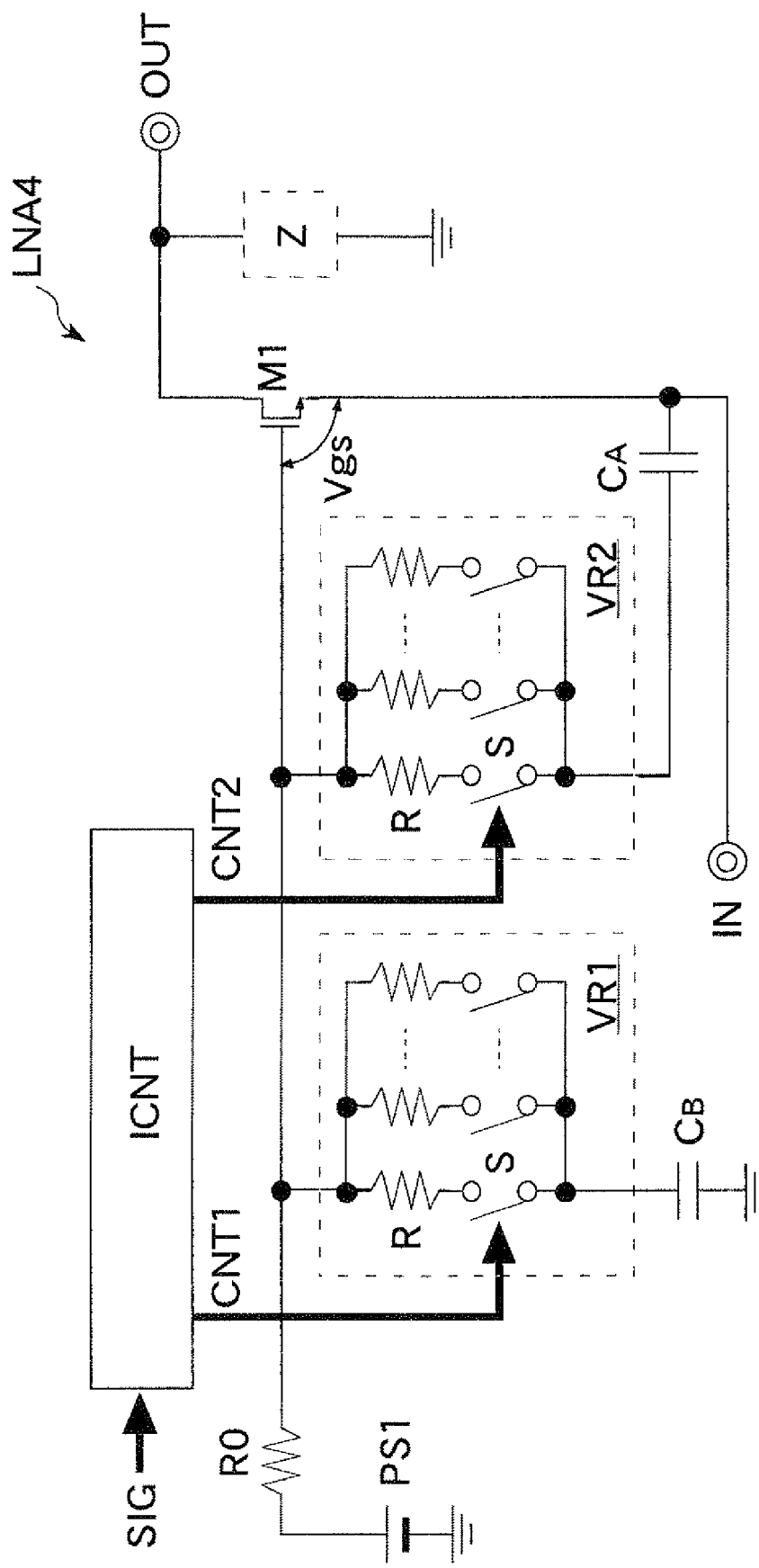
FIG. 5 illustrates a fourth embodiment of a low noise amplifier of the present invention.

FIG. 5 shows a fourth embodiment of the low noise amplifier of the present invention. The same element as that described in the first and second embodiments is given the same reference symbol to omit the detailed description thereof. In a low noise amplifier LNA4 of this embodiment, the variable impedance circuits Z1, Z2 shown in FIG. 1 are formed as variable resistance circuits VR1, VR2. Moreover, the impedance circuit Z0 shown in FIG. 1 is formed as the resistor R0. The resistance value of the resistor R0 is sufficiently larger than the impedances of the variable resistance circuits VR1, VR2 (e.g., from approximately 10 to 100 times) in a frequency band handled by the low noise amplifier LNA4. The low noise amplifier LNA4 is formed using the MOS process, and is mounted in the radio receiver shown in FIG. 2. Other configurations are the same as those of the first and second embodiments. That is, the low noise amplifier LNA4 (transistor M1) operates as a gate grounded amplifier.

The variable resistance circuits VR1, VR2 are configured with the capacitors C of the variable capacitance circuits VC1, VC2 shown in FIG. 3 being replaced by resistors R. Moreover, in the variable resistance circuit VR1, a capacitor CB is arranged between the switches S and ground. In the variable resistance circuit VR2, a capacitor CA is arranged between the switches S and the input terminal IN. The impedances of the capacitors CA, CB are designed sufficiently small relative to the impedances of the resistors R in order to make the former impedance invisible. That is, the capacitance values of the capacitors CA, CB are sufficiently large. Then, the impedances of the variable resistance circuits VR1, VR2 vary according to the number of switches S to turn on, respectively.

The resistor R is formed using a resistance of a diffusion layer, for example. For this reason, the resistors R and the switches C can be easily formed in the low noise amplifier LNA4 that is formed using the MOS process. Moreover, generally, when a resistor and a capacitor are formed on a semiconductor substrate, the area of the resistor can be made small as compared with the area of the capacitor. For this reason, the area of the low noise amplifier LNA4 of this embodiment can be made small as compared with that of the low noise amplifier LNA2 of the second embodiment. Furthermore, since the resistor does not have a dependence on frequency, a phase shift will not occur.

As described above, also in the fourth embodiment, the same effects as those of the first and second embodiments described above can be obtained. Furthermore, since the formation area of the elements can be reduced by forming the low noise amplifier LNA4 with the use of the resistance elements, the manufacturing cost can be reduced.

Figure 6:
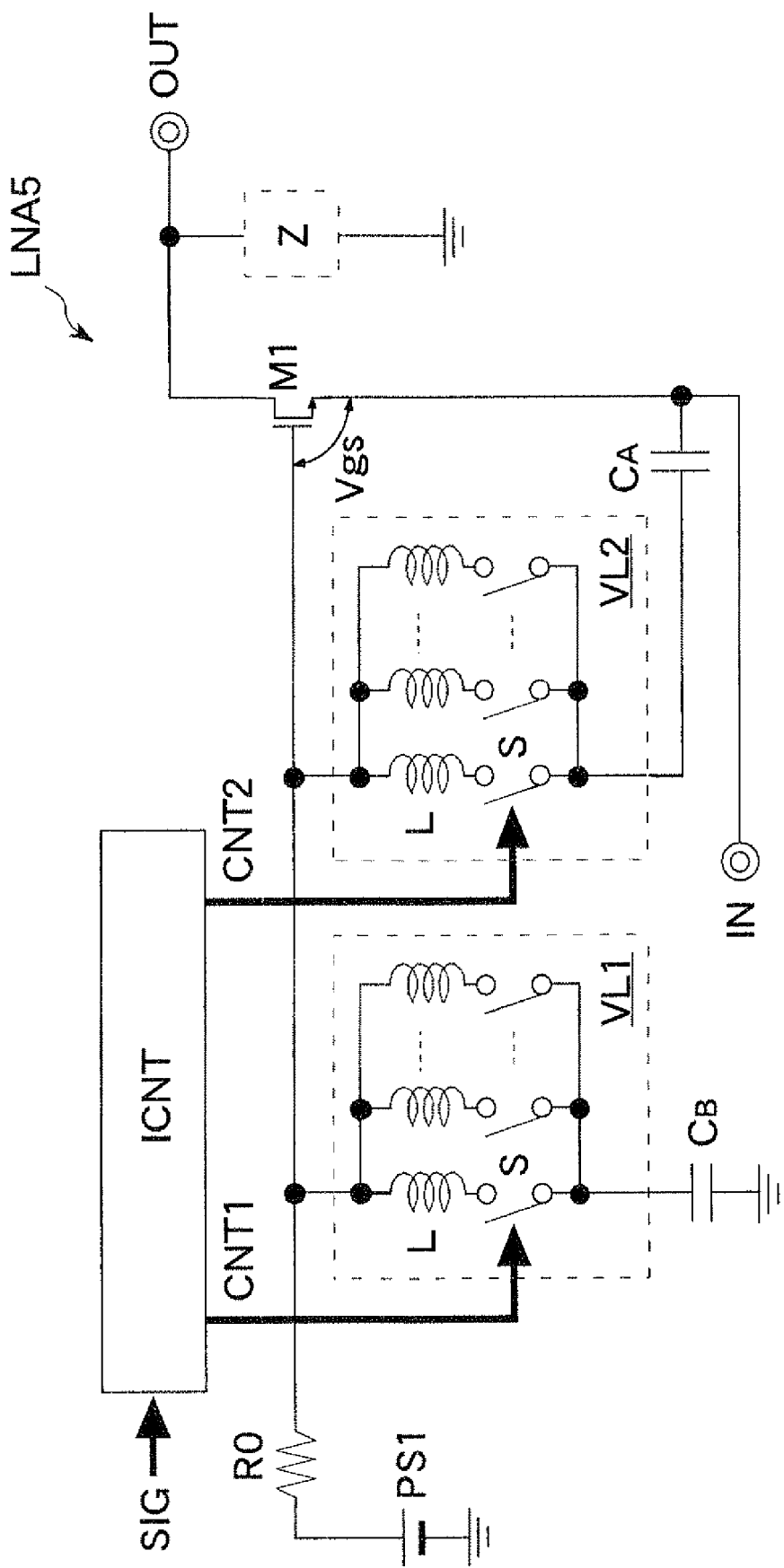
FIG. 6 illustrates a fifth embodiment of a low noise amplifier of the present invention.

FIG. 6 shows a fifth embodiment of the low noise amplifier of the present invention. The same element as that described in the first and second embodiments is given the same reference symbol to omit the detailed description thereof. In a low noise amplifier LNA5 of this embodiment, the variable impedance circuits Z1, Z2 shown in FIG. 1 are formed as variable inductance circuits VL1, VL2. Moreover, the impedance circuit Z0 shown in FIG. 1 is formed as the resistor R0. The resistance value of the resistor R0 is sufficiently larger than the impedances of the variable inductance circuits VL1, VL2 (e.g., from approximately 10 to 100 times) in a frequency band handled by the low noise amplifier LNA5. The low noise amplifier LNA5 is formed using the MOS process, and is mounted in the radio receiver shown in FIG. 2. Other configurations are the same as those of the first and second embodiments. That is, the low noise amplifier LNA5 (transistor M1) operates as a gate grounded amplifier.

The variable inductance circuits VL1, VL2 are configured with the capacitors C of the variable capacitance circuits VC1, VC2 shown in FIG. 3 being replaced by inductors L. Moreover, as in the fourth embodiment, in the variable inductance circuit VL1, the capacitor CB is arranged between the switches S and ground. In the variable inductance circuit VL2, the capacitor CA is arranged between the switches S and the input terminal IN. The impedances of the capacitors CA, CB are designed sufficiently small relative to the impedances of the inductors L in order to make the former impedance invisible. That is, the capacitance values of the capacitors CA, CB are sufficiently large. The inductor L is formed by stacking an insulator film and a conductive film above a semiconductor substrate, for example. For this reason, the inductors L and the switches C can be easily formed in the low noise amplifier LNA5 that is formed using the MOS process. Then, the impedances of the variable inductance circuits VL1, VL2 vary according to the number of switches S to turn on, respectively. As described above, also in the fifth embodiment, the same effects as those of the first and second embodiments described above can be obtained. Furthermore, the impedance of the inductor L has a dependence on frequency. This allows the low noise amplifier LNA5 having a frequency characteristic to be configured.

Figure 7:
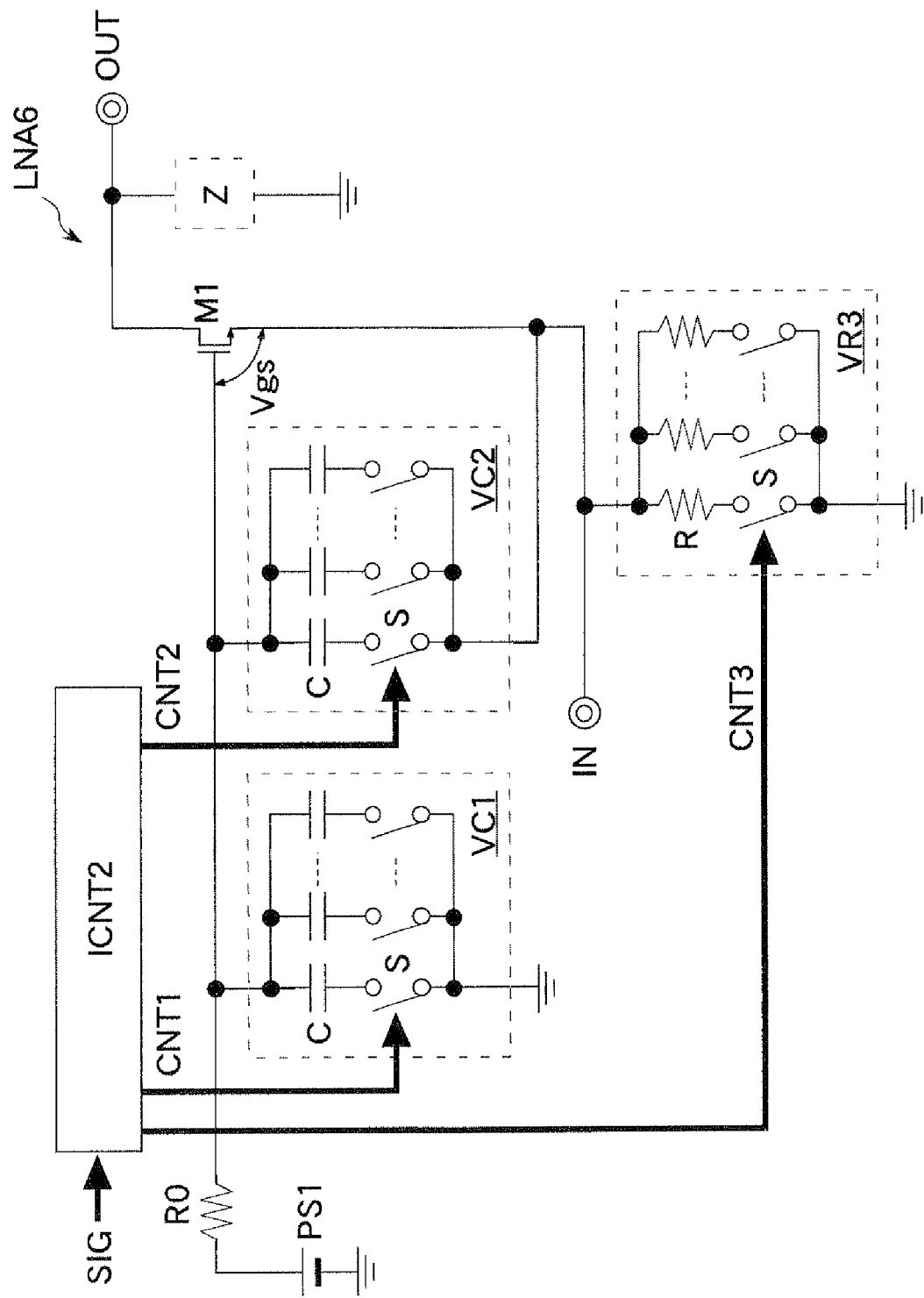
FIG. 7 illustrates a sixth embodiment of a low noise amplifier of the present invention.

FIG. 7 shows a sixth embodiment of the low noise amplifier of the present invention. The same element as that described in the first and second embodiments is given the same reference symbol to omit the detailed description thereof. In a low noise amplifier LNA6 of this embodiment, a variable resistance circuit VR3 (third variable impedance circuit) is added between the input terminal IN of the low noise amplifier LNA2 shown in FIG. 3 and ground. Moreover, a control circuit ICNT2 is formed instead of the control circuit ICNT of FIG. 3. Other configurations are the same as those of FIG. 2.

Generally, in order to efficiently input the input signal IN to the low noise amplifier, an impedance matching taking into account the coupling of the antenna ANT shown in FIG. 2 is required. In the low noise amplifier LNA2 of FIG. 3, when having changed the voltage amplitude Vgs, the effective transconductance gm' of the transistor M1 is given by gm×C1/(C1+C2). Here, C1, C2 are the capacitance values of the variable capacitance circuits VC1, VC2, and gm is the transconductance of the transistor M1. For this reason, when having changed the voltage amplitude Vgs, the input impedance Zin(=1/gm') of the gate grounded amplifier when viewed from the source terminal (input terminal IN side) will also vary. This may cause a deviation in the impedance matching, so that the input signal IN may be reflected without being input to the low noise amplifier. In this embodiment, this problem can be resolved.

As in the variable resistance circuits VR1, VR2 shown in FIG. 5, the variable resistance circuit VR3 includes a plurality of resistors R coupled in parallel between the input terminal IN and ground and a plurality of switches S that are coupled in series with the resistors R, respectively. For example, the number of bits of a control signal CNT3 is the same as the number of the switches S of the variable resistance circuit VR3. Each bit of the control signal CNT3 is coupled to a control terminal of the switch S. Then, the impedance of the variable resistance circuit VR3 varies depending on the number of switches S to turn on. Thus, the impedances of the variable capacitance circuits VC1-VC2 and the variable resistance circuit VR3 can be set to an arbitrary value according to the control signals CNT1-3.

In addition to the function of the control circuit ICNT described in FIG. 3, the control circuit ICNT2 includes a function to generate the control signal CNT3 according to a deviation in the input impedance when viewed from the input terminal IN. Specifically, the control circuit ICNT2 generates the control signal CNT3 so as to cancel a change in the input impedance that deviates due to a change in the impedances of the variable capacitance Circuits VC1, VC2. If the impedance of the variable resistance circuit VR3 is VR3 and the input impedance when the variable resistance circuit VR3 is not coupled is Zin, then the input impedance of the low noise amplifier LNA6 is given by VR3×Zin/(VR3+Zin). In order to keep this impedance at a desired value (e.g., 50 Ω)), for example, an increase in the impedance of the variable resistance circuit VR3 is set equal to an increase in the impedances of the variable Capacitance circuits VC1, VC2. This makes it possible to keep the impedance always at a desired value regardless of a change in the impedances of the variable capacitance circuits VC1, VC2.

Figure 9:
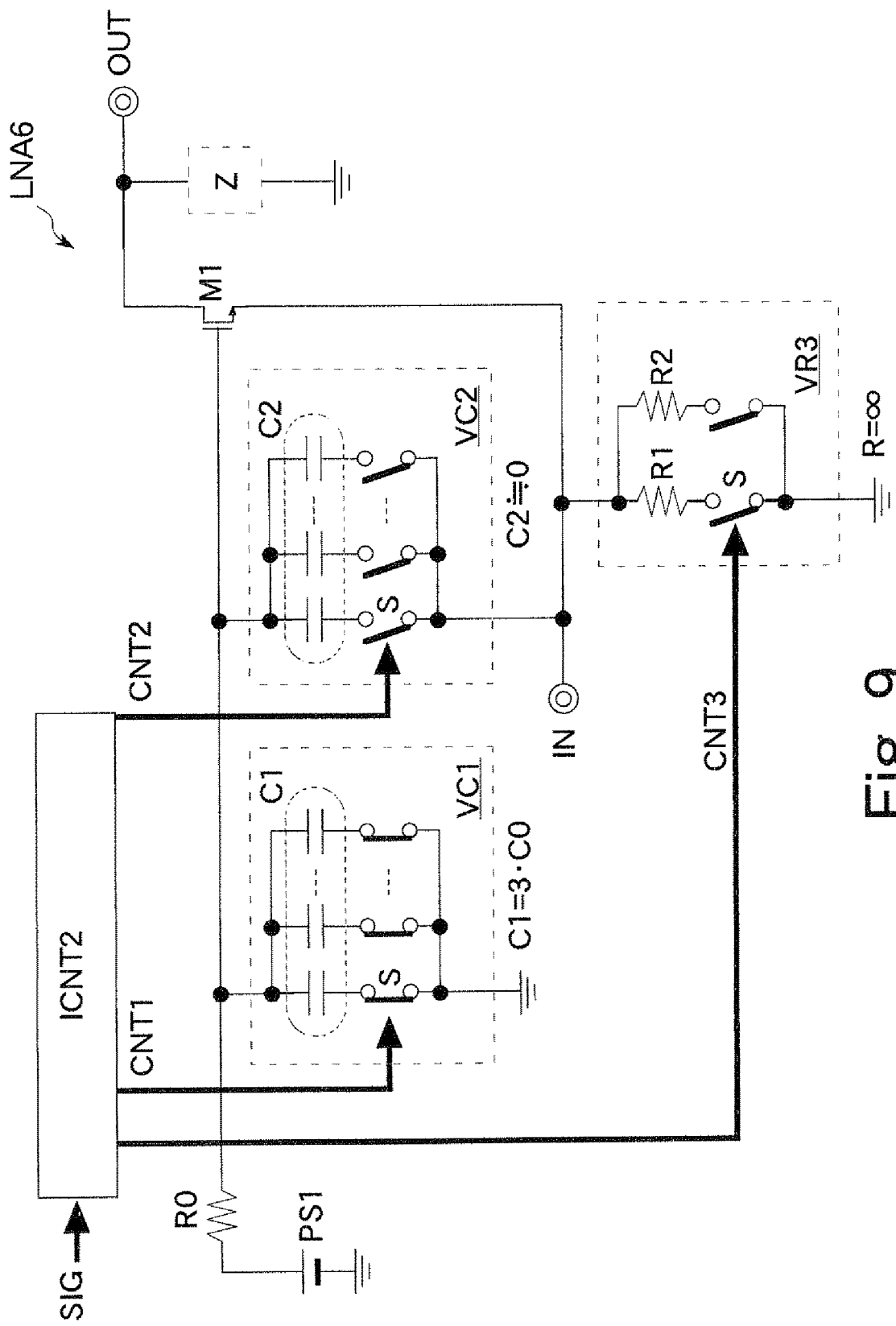
FIG. 9 illustrates a state of the switch corresponding to the state 1 in FIG. 8.
Figure 10:
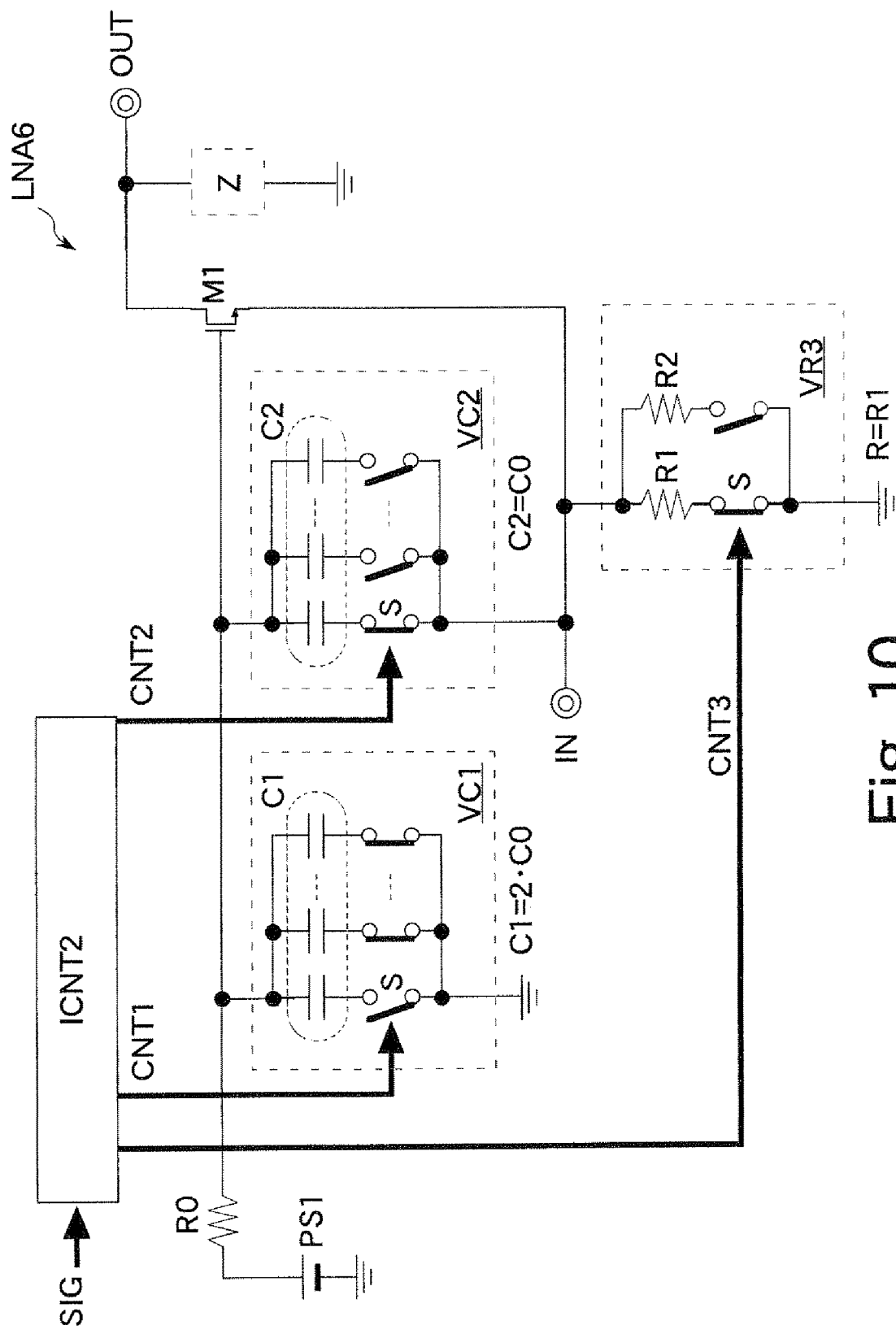
FIG. 10 illustrates a state of the switch corresponding to the state 2 in FIG. 8.
Figure 11:
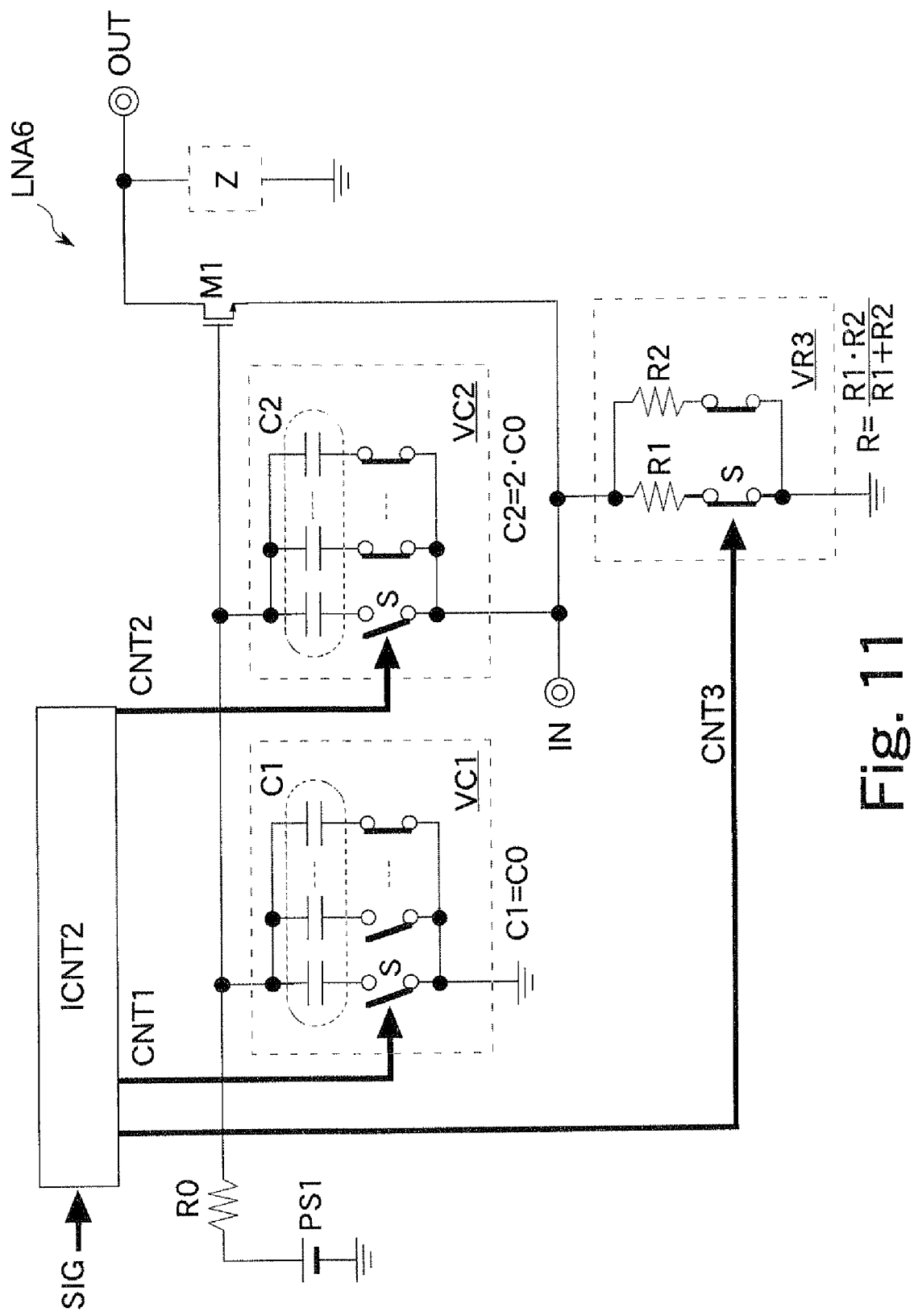
FIG. 11 illustrates a state of the switch corresponding to the state 3 in FIG. 8.

FIG. 8 shows an example of the impedance matching of the low noise amplifier LNA6 shown in FIG. 7. In this example, as shown in FIG. 9 to FIG. 11, the variable capacitance circuits VC1, VC2 are configured using three capacitors (capacitance units), respectively. The variable resistance circuit VR3 is configured using two resistors R1, R2.

The gm in FIG. 8 represents the transconductance of the transistor M1. The input impedance Zin of the low noise amplifier LNA6 is represented by the following equation (1).

Here, Gm represents the transconductance of the circuit and R represents the resistance value 10 of the variable resistance circuit VR3.

$Zin=((1/Gm) \cdot R)/((1/Gm)+R)$ (1)

In this embodiment, the impedance matching state (attenuation) is set to any one of state 1, state 2, and state 3, for example, by switching the switches S of the variable capacitance circuits VC1, VC2 and the variable resistance circuit VR3. FIG. 9 to FIG. 11 show a state of the switches S corresponding to state 1, state 2, and state 3, respectively.

In FIG. 9 to FIG. 11, the capacitance value of the capacitance unit is C0, and the on/off of the switches S is controlled so that three capacitance units are always coupled to the gate of the transistor M1 (number of units=3). In FIG. 9 to FIG. 11, R is the resistance value of the variable resistance circuit VR3.

The input impedance Zin in each of the states 1-3 is given by each of the equations shown in FIG. 8. If a simultaneous equation of the input impedance Zin is solved with gm=1/Zin in order to set the input impedances Zin of three states equal to each other, then both R1 and R2 become 3 Zin. Accordingly, by setting the resistance values of the resistors R1, R2 to the predetermined value, the input impedance Zin can be set always constant regardless of the states 1-3. That is, the input impedance Zin can be set constant even when the gain varies. Note that a change in the gain, when the output impedance is constant, can be expressed by a change in the transconductance Gm.

As described above, also in the sixth embodiment, the same effects as those of the first and second embodiments described above can be obtained. Furthermore, in this embodiment, a variable gain function can be achieved while always suppressing a change (deviation) in the input impedance. Furthermore, also in adding the variable resistance circuit VR3, an element causing an increase in noise is not arranged in the signal path from the input terminal IN to the output terminal OUT. Specifically, there is no resistor arranged in series with the signal path. For this reason, the noise characteristics of the low noise amplifier LNA6 can be improved. That is, also in the low noise amplifier LNA6 having a variable gain function and an impedance-matching function for the input signal IN, the noise characteristics can be improved.

Figure 12:
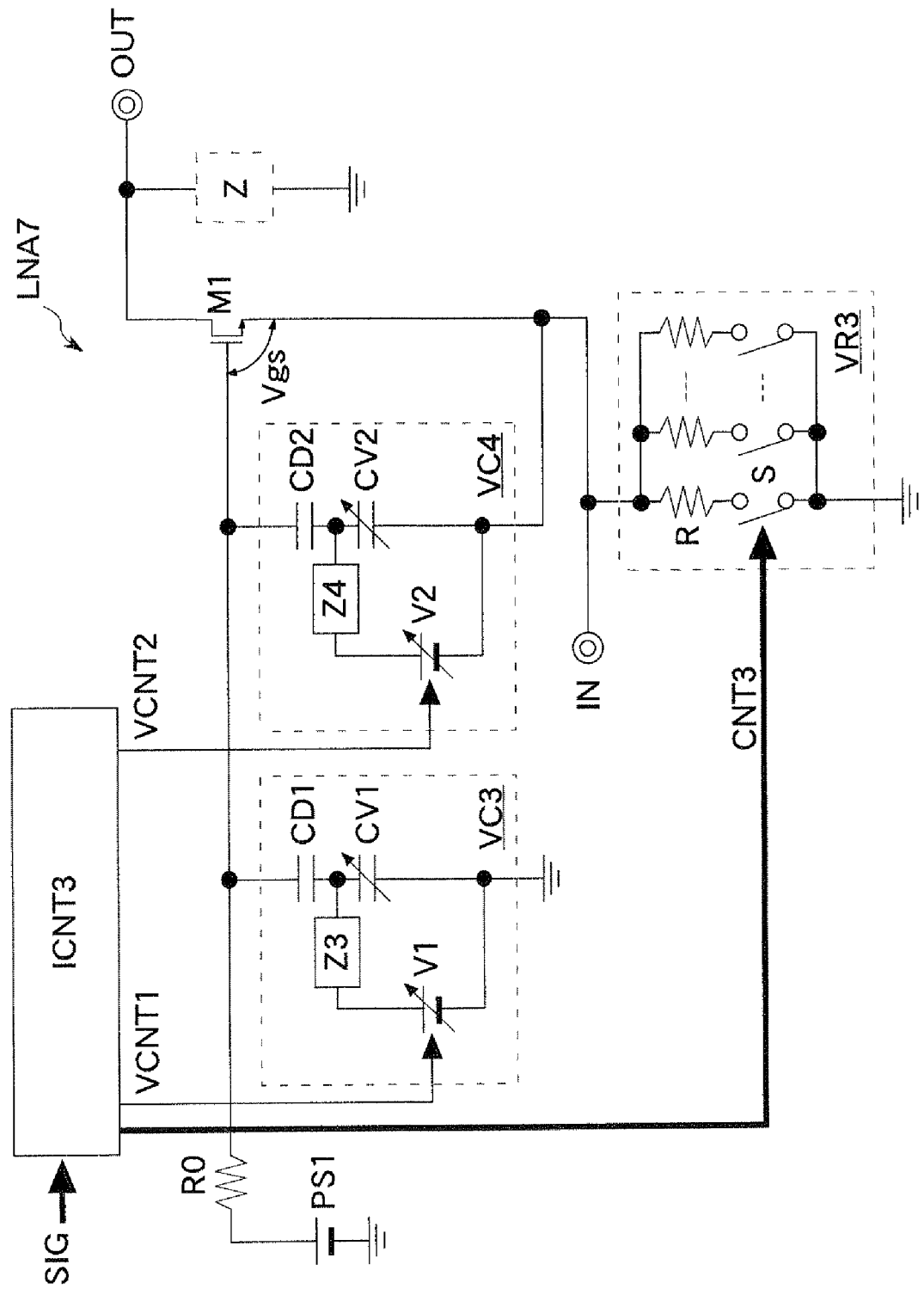
FIG. 12 illustrates a seventh embodiment of a low noise amplifier of the present invention.
Figure 13:
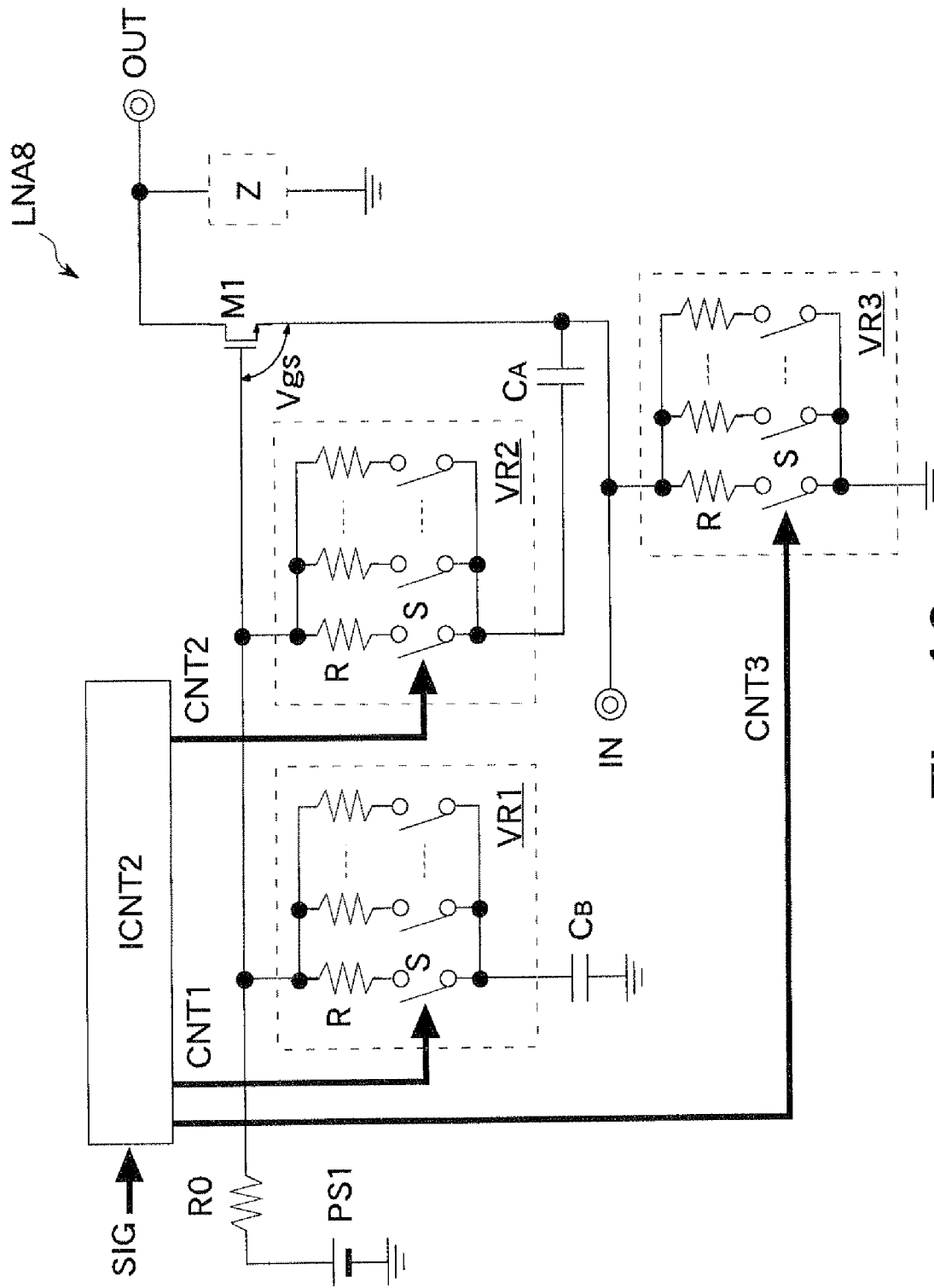
FIG. 13 illustrates an eighth embodiment of a low noise amplifier of the present invention.
Figure 14:
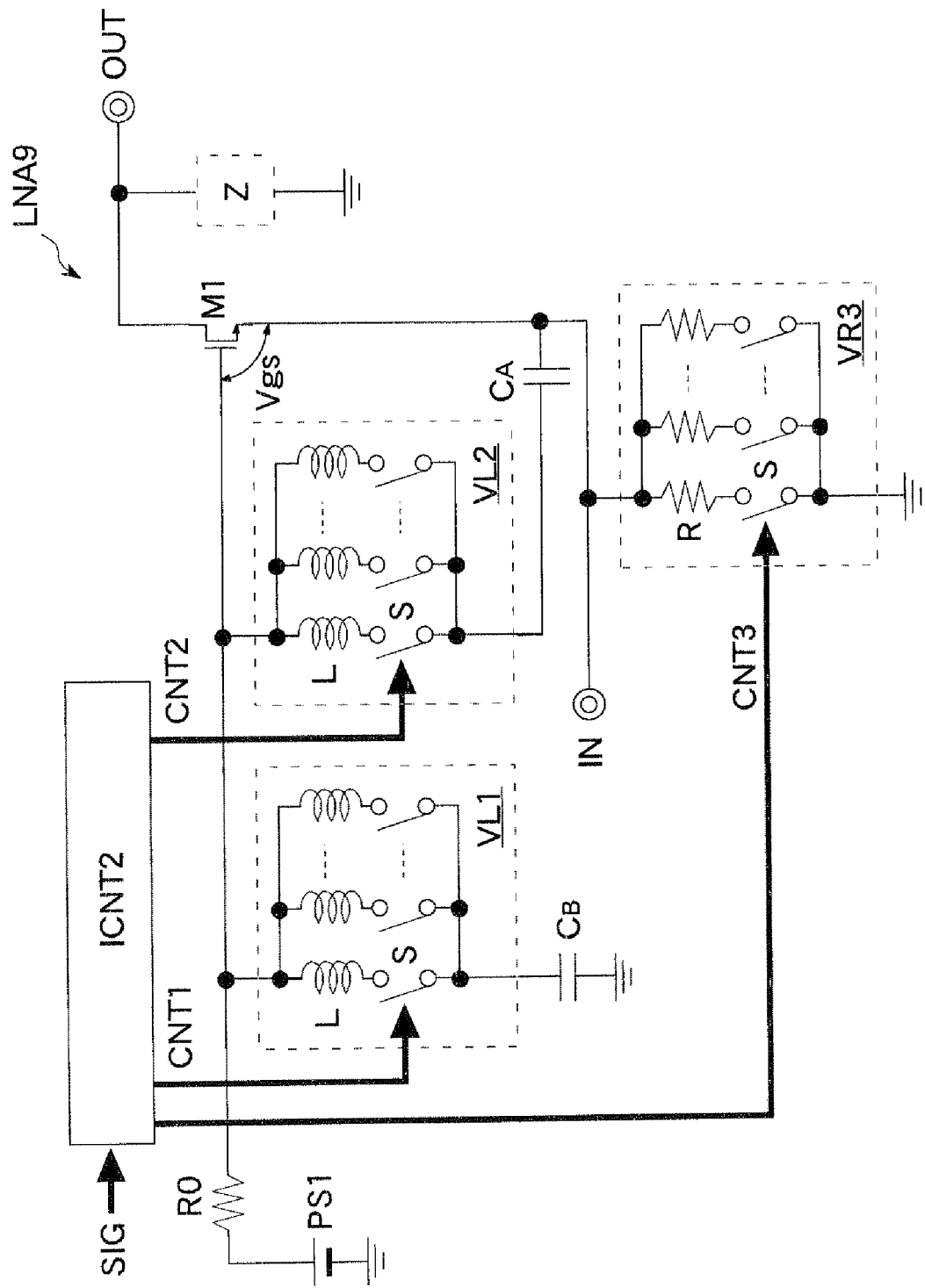
FIG. 14 illustrates a ninth embodiment of a low noise amplifier of the present invention.

FIG. 12, FIG. 13, and FIG. 14 show seventh, eighth, and ninth embodiments of the low noise amplifier of the present invention, respectively. The same element as that described in the first to sixth embodiments is given the same reference symbol to omit the detailed description thereof.

In a low noise amplifier LNA7 of FIG. 12, the variable resistance circuit VR3 (third variable impedance circuit) is added between the input terminal IN of the low noise amplifier LNA3 shown in FIG. 4 and ground. In a low noise amplifier LNA8 of FIG. 13, the variable resistance circuit VR3 (third variable impedance circuit) is added between the input terminal IN of the low noise amplifier LNA4 shown in FIG. 5 and ground. In a low noise amplifier LNA9 of FIG. 14, the variable resistance circuit VR3 (third variable impedance circuit) is added between the input terminal IN of the low noise amplifier LNA5 shown in FIG. 6 and ground. A control circuit ICNT3 shown in FIG. 12 outputs the control voltages VCNT1-3. Other configurations are the same as those of the sixth embodiment (FIG. 7). As described above, also in the seventh, eighth, and ninth embodiments, the same effects as those of the first to sixth embodiments described above can be obtained.

Figure 15:
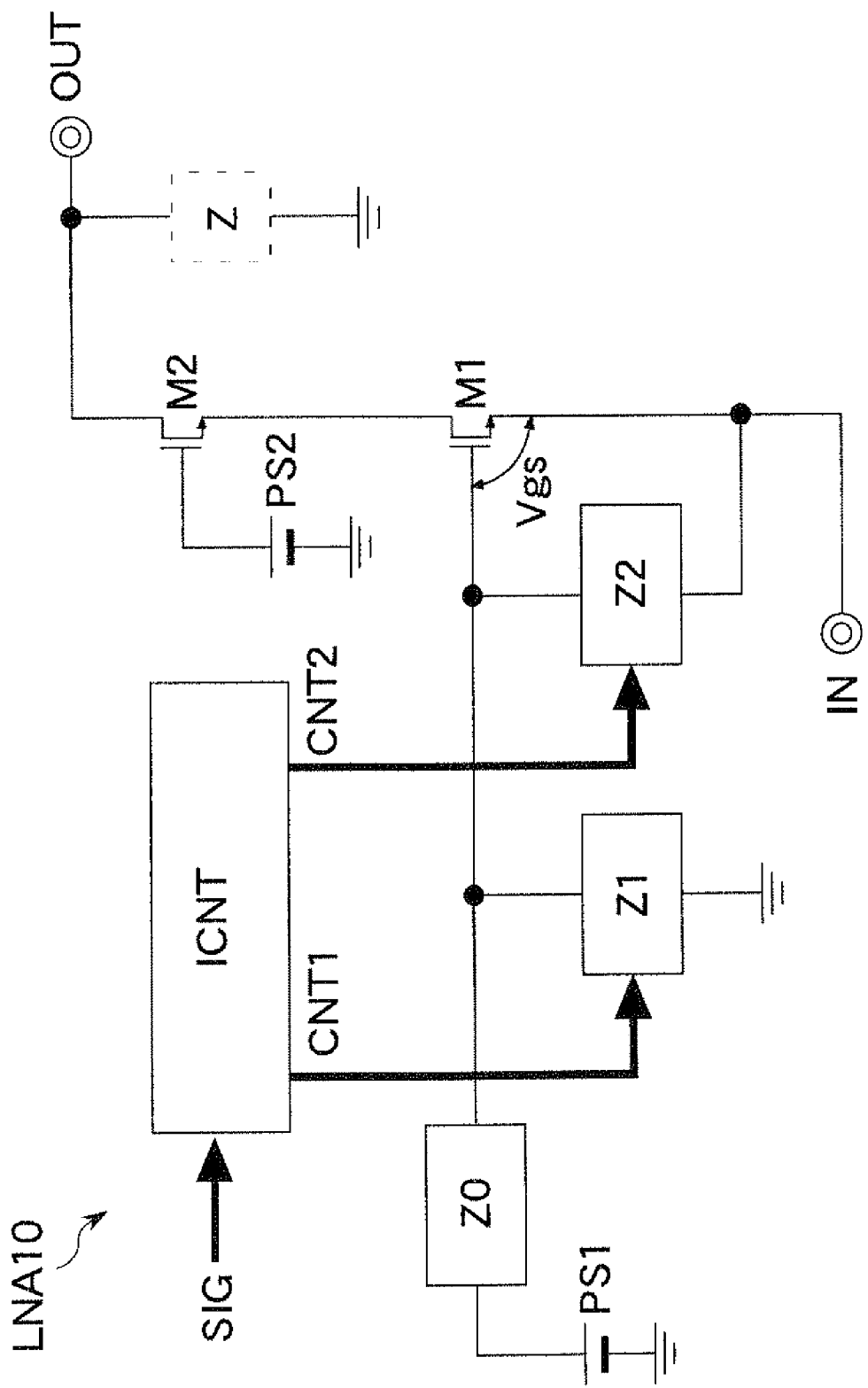
FIG. 15 illustrates a tenth embodiment of a low noise amplifier of the present invention.

FIG. 15 shows a tenth embodiment of the low noise amplifier of the present invention. The same element as that described in the first embodiment is given the same reference symbol to omit the detailed description thereof. In a low noise amplifier LNA10 of this embodiment, an nMOS transistor M2 (second transistor) is arranged between the drain of the transistor M1 of the low noise amplifier LNA1 and the output terminal OUT shown in FIG. 1. A gate of the transistor M2 is coupled to a power supply PS2 (second voltage source). That is, the low noise amplifier LNA10 is configured as a cascode amplifier. Other configurations are the same as those of FIG. 1. Note that a predetermined voltage may be applied to the gate of the transistor M2 using a current source instead of the power supply PS2 (voltage source). As described above, also when the present invention is applied to the cascode amplifier, the same effects as those of the above-described embodiments can be obtained.

Figure 16:
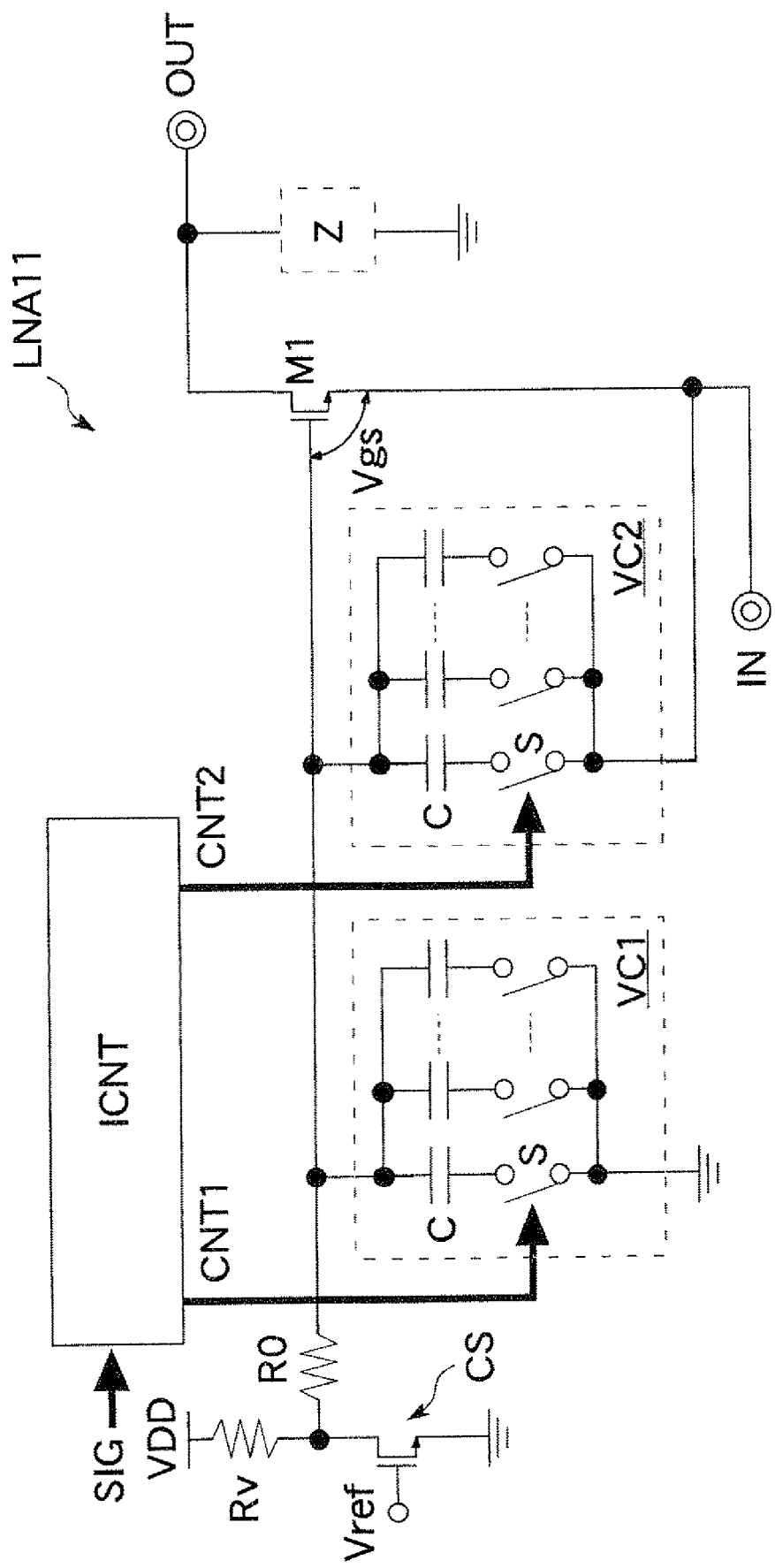
FIG. 16 illustrates an eleventh embodiment of a low noise amplifier of the present 1 5 invention.

FIG. 16 shows an eleventh embodiment of the low noise amplifier of the present invention. The same element as that described in the first and second embodiments is given the same reference symbol to omit the detailed description thereof. In a low noise amplifier LNA11 of this embodiment, a current source CS is arranged instead of the voltage source PS1 of the low noise amplifier LNA2 shown in FIG. 3. The current source CS includes an nMOS transistor whose source is coupled to a ground wire and whose drain is coupled to a power source line VDD via a resistor Rv, the nMOS transistor receiving a reference voltage (fixed voltage) Vref at the gate. Thus, a predetermined voltage is applied to the gate of the transistor M1 via the resistor R0. Other configurations are the same as those of FIG. 3. As described above, also in the eleventh embodiment, the same effects as those of the first and second embodiments described above can be obtained.

Note that, in the first embodiment described above, an example has been described, in which the control signals CNT1-2 are generated according to the signal strength of the amplified signal SIG output from the output terminal OUT of the low noise amplifier LNA1. The present invention is not limited to such embodiment. For example, the control signals CNT1-2 may be generated according to a signal level output from a circuit coupled to the output of the low noise amplifier LNA1. For example, using an output signal (digital signal) of the A/D converter ADC, the control circuit ICNT can be configured with a simple digital circuit.

In the fourth and fifth embodiments described above, examples have been described, in which the low noise amplifiers LNA4, LNA5 are formed using the enhancement type nMOS transistor M1. The present invention is not limited to such embodiments. For example, when a depression type nMOS transistor is used, a low noise amplifier can be configured by removing the power supply PS1 and the capacitors CA, CB from the circuits shown in FIG. 5 and FIG. 6.

Figure 17:
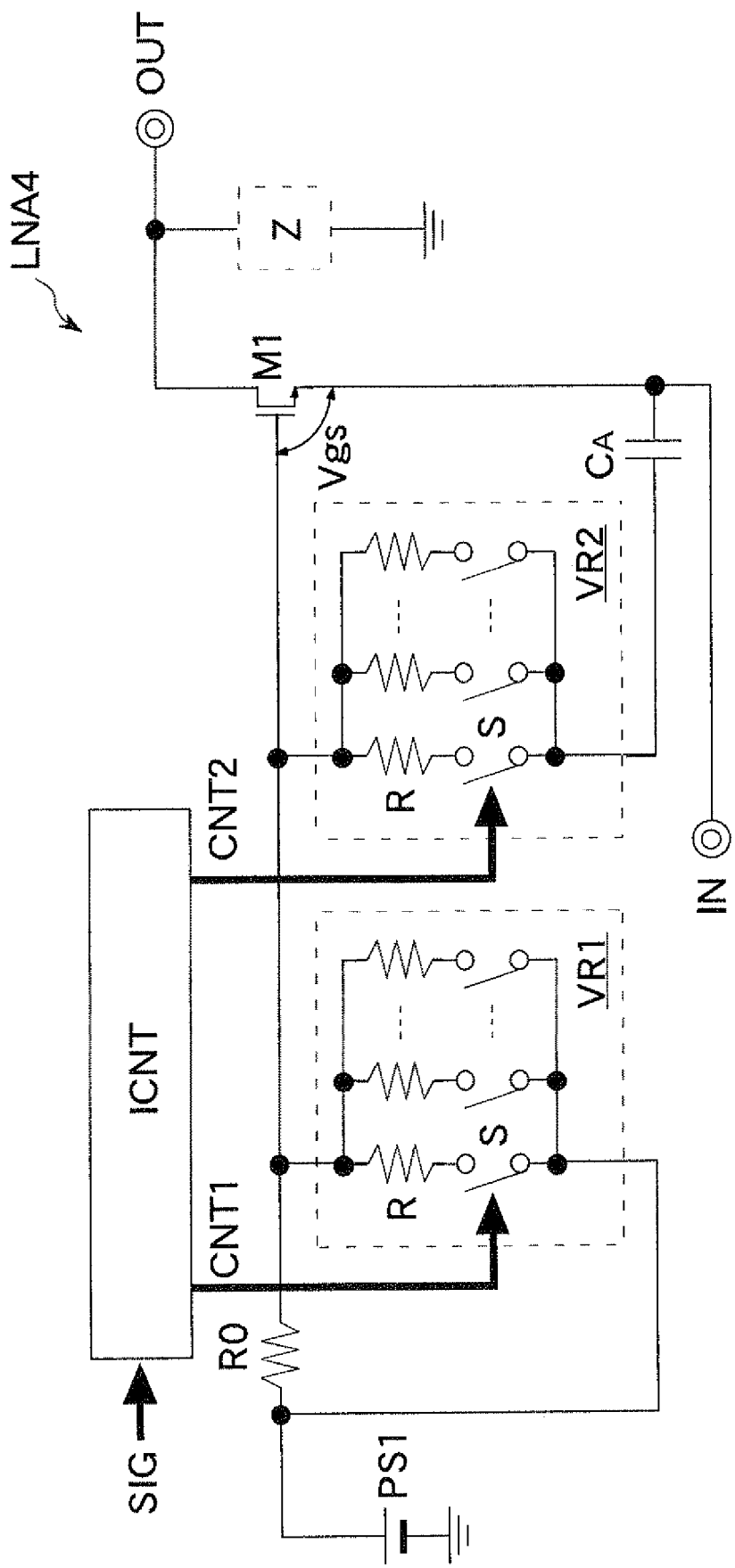
FIG. 17 illustrates a modified example of the low noise amplifier shown in FIG. 5.
Figure 18:
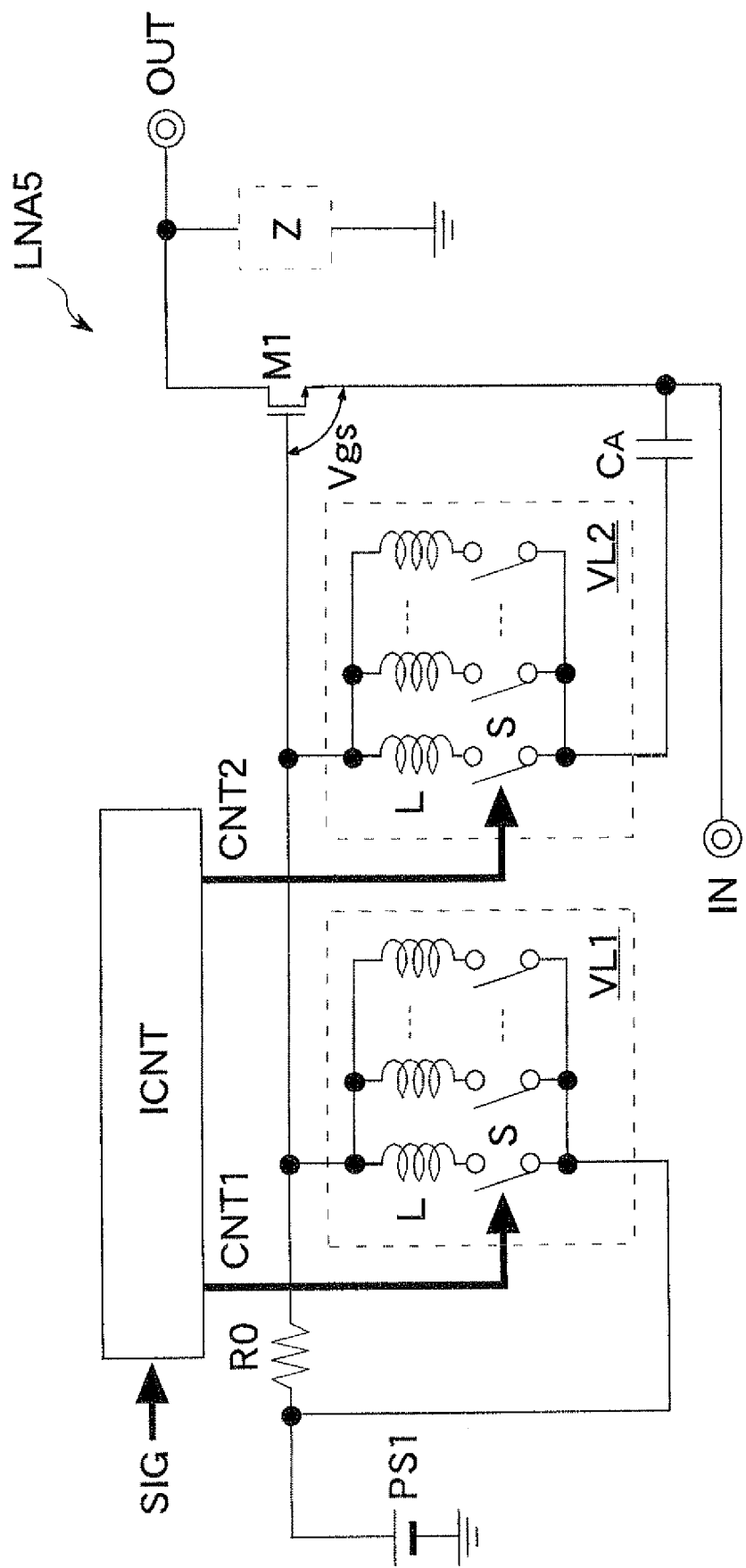
FIG. 18 illustrates a modified example of the low noise amplifier shown in FIG. 6.

In the fourth and fifth embodiments described above, examples have been described, in which the capacitance CB is coupled to the variable resistance circuit VR1 and the variable inductance circuit VL1. The present invention is not limited to such embodiments. For example, as shown in FIG. 17 and FIG. 18, the switches of the variable resistance circuit VR1 and the variable inductance circuit VL1 may be coupled to the power supply PS1. In this case, the impedance of the capacitor CA is designed sufficiently small relative to the impedances of the resistor R and the inductor L in order to make the former impedance invisible. That is, the capacitance value of the capacitor CA is sufficiently large. If the power supply PS1 and the capacitance CB are removed from the configurations shown in FIG. 17 and FIG. 18, the present invention can be also applied to the above-described low noise amplifier using a depression type nMOS transistor.

Figure 19:
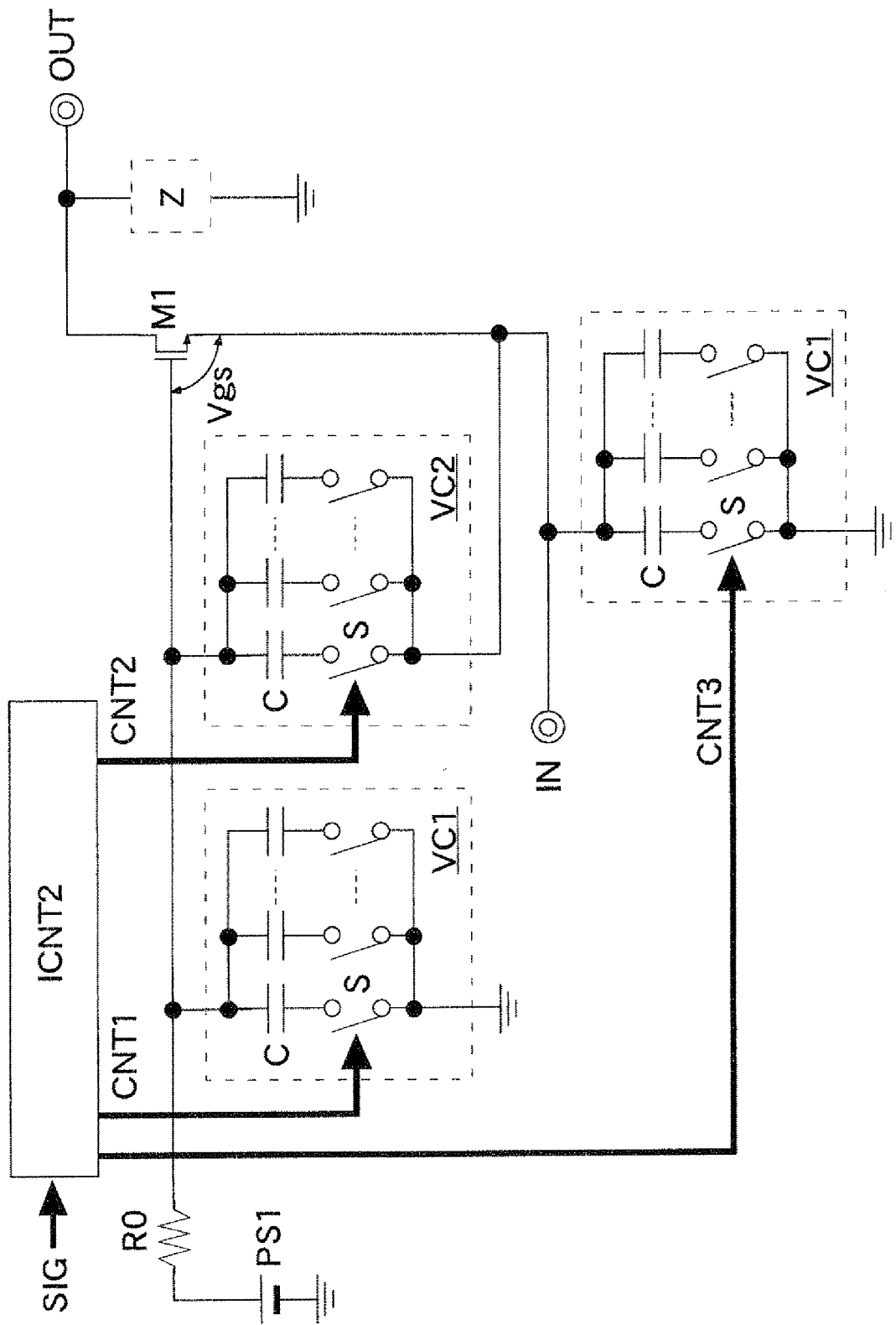
FIG. 19 illustrates another example of the third variable impedance circuit.
Figure 20:
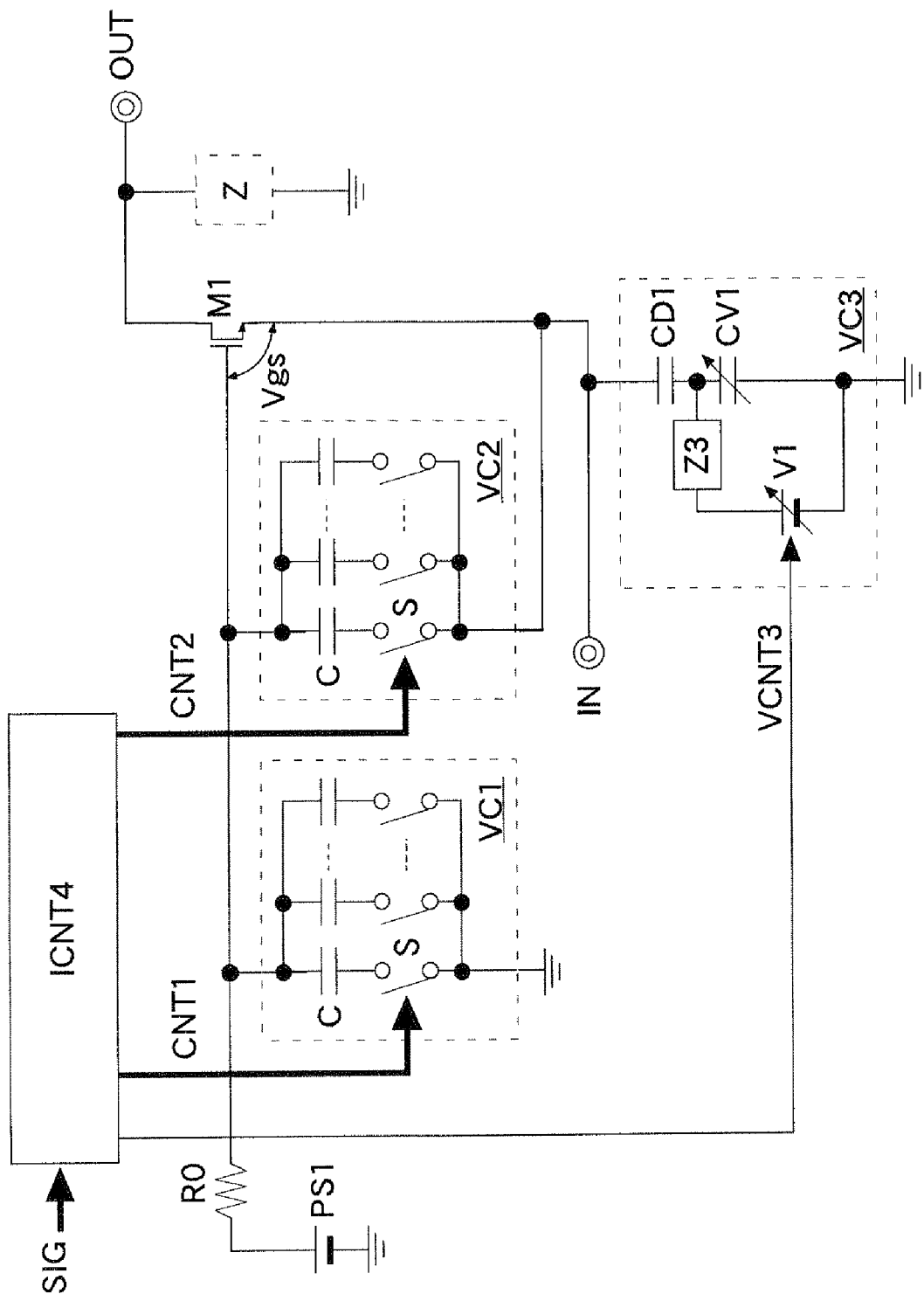
FIG. 20 illustrates another example of the third variable impedance circuit.
Figure 21:
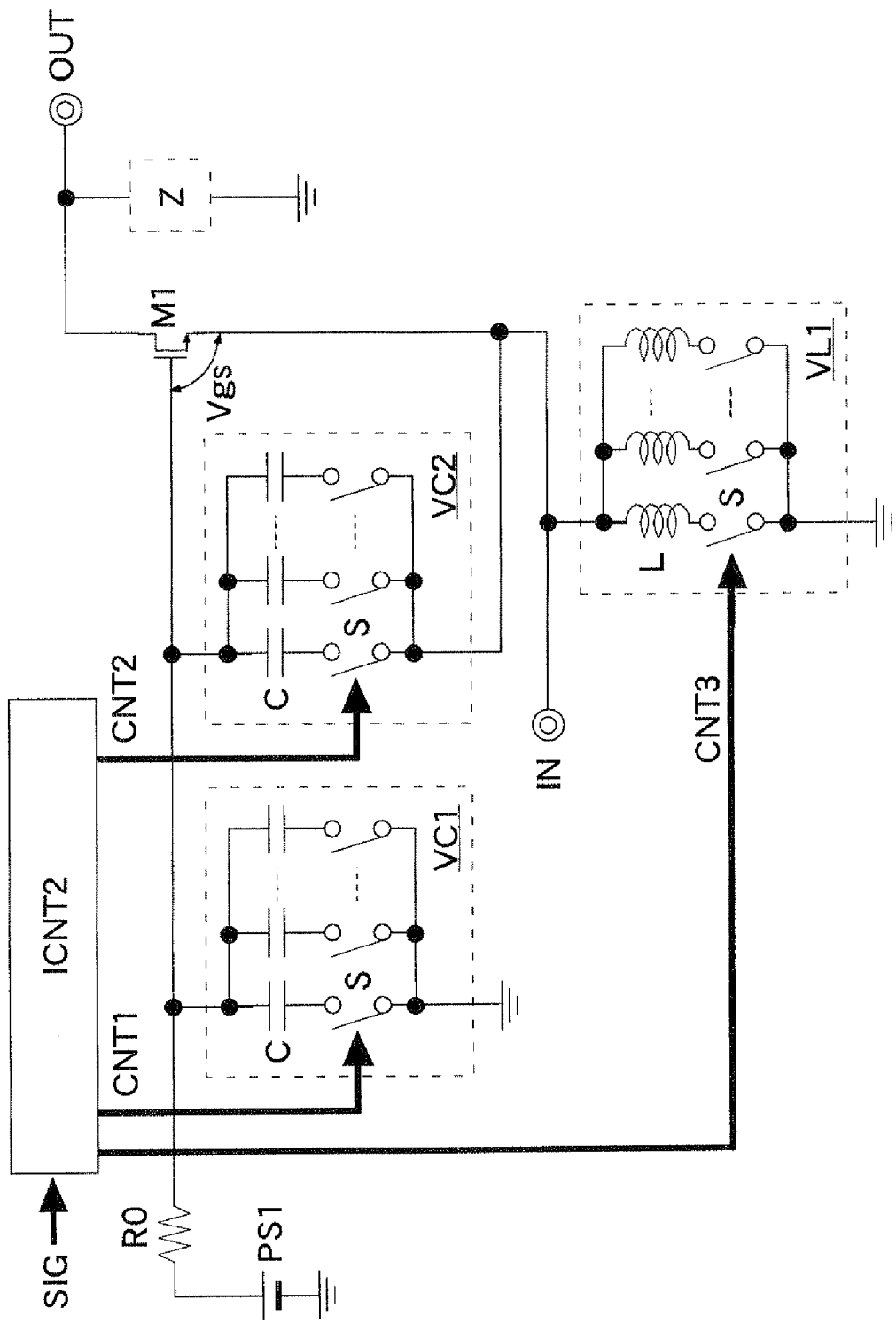
FIG. 21 illustrates another example of the third variable impedance circuit.

In the sixth to ninth embodiments described above, examples have been described, in which the variable resistance circuit VR3 (third variable impedance circuit) is added between the input terminal IN of the low noise amplifier and ground. The present invention is not limited to such embodiments. For example, as shown in FIG. 19, the third variable impedance circuit may be configured using the variable capacitance circuit VC1 shown in FIG. 3. As shown in FIG. 20, the third variable impedance circuit may be configured using the variable capacitance circuit VC3 shown in FIG. 4. Alternatively, as shown in FIG. 21, the third variable impedance circuit may be configured using the variable inductance circuit VL1 shown in FIG. 6. In this way, the first to third variable impedance circuits can be configured using the variable capacitance circuit, the variable resistance circuit, or the variable inductance circuit.

In the third and seventh embodiments described above, examples have been described, in which the impedances of the variable capacitance circuits VC3-4 are continuously changed using the variable control voltages VCNT1-2. The present invention is not limited to such embodiments. For example, the impedances of the variable capacitance circuits VC3-4 may be changed in a stepwise fashion using a control voltage that varies at a predetermined increment.

In the tenth embodiment described above, an example of applying the present invention to a cascode amplifier has been described. The present invention is not limited to such embodiment. The low noise amplifiers LNA2-LNA9 of FIG. 3 to FIG. 7, and FIG. 12 to FIG. 14 may be configured as a cascode amplifier by adding the transistor M2 shown in FIG. 15 thereto, for example.

In the above third to tenth embodiments, examples have been described, in which the voltage source PS1 is used to apply a voltage to the gate of the transistor M1. The present invention is not limited to such embodiments. For example, the current source CS of the eleventh embodiment may be used to apply a voltage to the gate of the transistor M1.

A proposition of the embodiments is to improve the noise characteristics in a low noise amplifier having a variable gain function.

According to one aspect of embodiments, for a first transistor, a source thereof is coupled to an input terminal and a drain thereof is coupled to an output terminal. A first variable impedance circuit is arranged between a gate of the first transistor and ground, and the impedance thereof is changed according to a first control signal. A second variable impedance circuit is arranged between the gate and the source of the first transistor, and the impedance thereof is changed according to a second control signal. Furthermore, an impedance circuit is arranged between the gate of the first transistor and a power supply. The ratio of the impedances of the first and second variable impedance circuits can be set to an arbitrary value according to the first and second control signals in order to change the gain of the low noise amplifier. In other words, a gain-variable low noise amplifier can be configured without arranging an element, which increases noise, in the signal path from the input terminal to the output terminal. As the result, the generation of unwanted thermal noise can be prevented and the noise characteristics of the low noise amplifier can be improved.

According to another aspect of the embodiments, a control circuit generates the first and second control signals according to the signal strength of an amplified signal output to the output terminal. By generating the first and second control signals using the output signal of the low noise amplifier, the gain adjustment for keeping the output level of the low noise amplifier constant can be made easily. In particular, this is effective in cases where the input power level (reference level) input to the low noise amplifier fluctuates.

According to another aspect of the embodiments, at least one of the first and second variable impedance circuits is a variable capacitance circuit. For example, the variable capacitance circuit includes a plurality of capacitors coupled in parallel and a plurality of switches that are coupled in series with the capacitances, respectively. Alternatively, the variable capacitance circuit includes a variable capacitor and a fixed capacitor whose capacitance is fixed, the variable capacitor and the fixed capacitor being coupled in series, and a voltage input terminal which is coupled to a coupling node between the variable capacitor and the fixed capacitor and which receives a variable voltage.

According to another aspect of the embodiments, the control circuit generates a variable voltage according to the signal strength of an amplified signal output to the output terminal. For example, this makes it possible to provide a continuously varying voltage to the voltage input terminal of the variable capacitance circuit. As the result, the impedance of the variable capacitor can be changed continuously and the gain of the low noise amplifier can be finely adjusted. There is no need to arrange elements, such as a plurality of resistors, in the signal path from the input terminal to the output terminal for the purpose of fine adjustment of the gain. For this reason, the generation of unwanted thermal noise can be prevented and the noise characteristics of the low noise amplifier can be improved.

According to another aspect of the embodiments, at least one of the first and second variable impedance circuits is a variable resistance circuit or a variable inductance circuit. For example, the variable resistance circuit includes a plurality of resistors coupled in parallel and a plurality of switches that are coupled in series with the resistors, respectively. For example, the variable inductance circuit includes a plurality of inductors coupled in parallel and a plurality of switches that are coupled in series with the inductors, respectively.

According to another aspect of the embodiments, a third variable impedance circuit is arranged between the source of the first transistor and ground, and the impedance thereof is changed according to a third control signal. By changing the impedance of the third variable impedance circuit according to the amount of change in the impedances of the first and second variable impedance circuits, the impedance when viewed from the input terminal can be kept always constant. In this case, an element to increase noise will not be arranged in the signal path from the input terminal to the output terminal. As the result, the generation of unwanted thermal noise can be prevented even when an impedance-matching function is added, and the noise characteristics of the low noise amplifier can be improved.

According to another aspect of the embodiments, the control circuit generates the third control signal according to the signal strength of an amplified signal output to the output terminal. Specifically, when a total impedance of the first and second variable impedance circuits increases, the control circuit generates the third control signal in order to increase the impedance of the third variable impedance circuit by the same value as the value of the change in the total impedance. Thereby, the impedance when viewed from the input terminal can be kept always constant without degrading the noise characteristics of the low noise amplifier.

According to another aspect of the embodiments, a second transistor is arranged between the drain of the first transistor and the output terminal, and the gate thereof is coupled to either of a second voltage source and a second current source. That is, a cascode low noise amplifier is configured. The design flexibility of the cascode amplifier is high, and the cascode amplifier has an excellent frequency response characteristic. That is, in the low noise amplifier, the design flexibility of which is high and which has an excellent frequency characteristic, the generation of unwanted thermal noise can be prevented and the noise characteristics can be improved.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An amplifier, comprising:
a first transistor having a source coupled to an input terminal and a drain coupled to an output terminal;
a first variable impedance circuit arranged between a gate of the first transistor and ground, and having an impedance changed according to a first control signal;
a second variable impedance circuit arranged between the gate and source of the first transistor, and having an impedance changed according to a second control signal; and
an impedance circuit arranged between the gate of the first transistor and a power supply.

2. The amplifier according to claim 1, further comprising
a control circuit generating the first and second control signals according to a signal strength of an amplified signal output to the output terminal.

3. The amplifier according to claim 1, wherein
at least one of the first and second variable impedance circuits is a variable capacitance circuit.

4. The amplifier according to claim 3, wherein
the variable capacitance circuit comprises:
a plurality of capacitors coupled in parallel; and
a plurality of switches coupled in series with the capacitors, respectively.

5. The amplifier according to claim 3, wherein
the variable capacitance circuit comprises:
a variable capacitor and a fixed capacitor having a fixed capacitance, the capacitors being coupled in series; and
a voltage input terminal coupled to a coupling node between the variable capacitor and the fixed capacitor, and receiving a variable voltage.

6. The amplifier according to claim 5, further comprising
a control circuit generating the variable voltage according to a signal strength of an amplified signal output to the output terminal.

7. The amplifier according to claim 1, wherein
at least one of the first and second variable impedance circuits is a variable resistance circuit.

8. The amplifier according to claim 7, wherein
the variable resistance circuit comprises:
a plurality of resistors coupled in parallel; and
a plurality of switches coupled in series with the resistors, respectively.

9. The amplifier according to claim 1, wherein
at least one of the first and second variable impedance circuits is a variable inductance circuit.

10. The amplifier according to claim 9, wherein
the variable inductance circuit comprises:
a plurality of inductors coupled in parallel; and
a plurality of switches coupled in series with the inductors, respectively.

11. The amplifier according to claim 1, further comprising
a third variable impedance circuit arranged between the source of the first transistor and ground, and having an impedance changed according to a third control signal.

12. The amplifier according to claim 1, further comprising
a control circuit generating the third control signal according to a signal strength of an amplified signal output to the output terminal, wherein
the control circuit generates the third control signal in order to increase an impedance of the third variable impedance circuit by the same value as the changed value in the total impedance when a total impedance of the first and second variable impedance circuits increases.

13. The amplifier according to claim 11, wherein
the third variable impedance circuit is a variable capacitance circuit.

14. The amplifier according to claim 13, wherein
the variable capacitance circuit comprises:
a plurality of capacitors coupled in parallel; and
a plurality of switches coupled in series with the capacitors, respectively.

15. The amplifier according to claim 13, wherein
the variable capacitance circuit comprises:
a variable capacitor and a fixed capacitor having a fixed capacitance, the capacitors being coupled in series; and
a voltage input terminal coupled to a coupling node between the variable capacitor and the fixed capacitor, and receiving a variable voltage.

16. The amplifier according to claim 15, further comprising
a control circuit generating the variable voltage according to a signal strength of an amplified signal output to the output terminal.

17. The amplifier according to claim 11, wherein
the third variable impedance circuit is a variable resistance circuit.

18. The amplifier according to claim 11, wherein
the third variable impedance circuit is a variable inductance circuit.

19. The amplifier according to claim 1, further comprising
a second transistor arranged between a drain of the first transistor and the output terminal, and having a gate coupled to one of a second voltage source and a second current source.

* * * * *